(12) United States Patent
Yang et al.

(10) Patent No.: US 10,759,993 B2
(45) Date of Patent: Sep. 1, 2020

(54) QUANTUM DOT COMPOSITION, QUANTUM DOT POLYMER COMPOSITE, AND LAYERED STRUCTURE AND ELECTRONIC DEVICES INCLUDING THE SAME

(71) Applicant: SAMSUNG ELECTRONICS CO., LTD., Suwon-si, Gyeonggi-do (KR)

(72) Inventors: Hyeyeon Yang, Suwon-si (KR); Jongmin Lee, Hwaseong-si (KR); Shin Ae Jun, Seongnam-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 16/180,376

(22) Filed: Nov. 5, 2018

(65) Prior Publication Data
US 2019/0136126 A1    May 9, 2019

(30) Foreign Application Priority Data

Nov. 3, 2017 (KR) .................. 10-2017-0145916

(51) Int. Cl.
*C09K 11/02* (2006.01)
*G02F 1/13357* (2006.01)
(Continued)

(52) U.S. Cl.
CPC .............. *C09K 11/025* (2013.01); *C07F 3/06* (2013.01); *G02B 6/005* (2013.01);
(Continued)

(58) Field of Classification Search
CPC ..... C09K 11/025; C09K 11/06; C09K 11/703; C09K 11/883; C09K 2211/188; G02B 6/005; H01L 51/0092; H01L 51/502; B82Y 20/00; B82Y 30/00; Y10T 428/1036; Y10T 428/1041; Y10S 977/774
(Continued)

(56) References Cited

U.S. PATENT DOCUMENTS 7,476,487 B2    1/2009  Park et al.
7,746,423 B2    6/2010  Im et al.
(Continued)

FOREIGN PATENT DOCUMENTS

JP    2010-209141 A    9/2010
KR    2015-0036127 A    4/2015
(Continued)

OTHER PUBLICATIONS

Extended European Search Report dated Mar. 14, 2019, issued for the corresponding European Patent Application No. 182042853-1105, 9 pages.
(Continued)

*Primary Examiner* — Ruiyun Zhang
(74) *Attorney, Agent, or Firm* — Cantor Colburn LLP

(57) ABSTRACT

A quantum dot composition comprising a quantum dot, a metal thiolate complex compound, and a solvent, wherein the metal thiolate complex compound includes a hydrophobic moiety, a thioether moiety (—S—), and a polyvalent metal, and wherein the hydrophobic moiety includes a fluorinated organic group, a multi-aromatic ring-containing group having a backbone structure that includes a quaternary carbon atom, which is a part of a cyclic group, and two aromatic rings bound to the quaternary carbon atom, or a combination thereof.

28 Claims, 13 Drawing Sheets

(51) Int. Cl.

| | | |
|---|---|---|
| *C07F 3/06* | (2006.01) | |
| *F21V 8/00* | (2006.01) | |
| *G03F 7/16* | (2006.01) | |
| *G03F 7/20* | (2006.01) | |
| *G03F 7/32* | (2006.01) | |
| *G03F 7/38* | (2006.01) | |
| *H01L 27/32* | (2006.01) | |
| *G02F 1/1335* | (2006.01) | |

(52) U.S. Cl.
CPC ........ *G02F 1/133617* (2013.01); *G03F 7/162* (2013.01); *G03F 7/168* (2013.01); *G03F 7/2004* (2013.01); *G03F 7/322* (2013.01); *G03F 7/38* (2013.01); *G02F 1/133514* (2013.01); *G02F 2202/36* (2013.01); *H01L 27/322* (2013.01); *Y10T 428/1036* (2015.01); *Y10T 428/1041* (2015.01)

(58) Field of Classification Search
USPC ........... 428/1.3, 1.31, 1.1; 257/40, 12; 549/3
See application file for complete search history.

(56) References Cited

U.S. PATENT DOCUMENTS

| | | | |
|---|---|---|---|
| 8,920,675 | B2 | 12/2014 | Xu et al. |
| 9,196,682 | B2 | 11/2015 | Jang et al. |
| 9,373,749 | B2 | 6/2016 | Tu et al. |
| 9,904,109 | B2 | 2/2018 | Han et al. |
| 2011/0084250 | A1 | 4/2011 | Jang et al. |
| 2014/0024047 | A1 | 1/2014 | Kairdolf et al. |
| 2014/0027711 | A1 | 1/2014 | Breen et al. |
| 2015/0183943 | A1 | 7/2015 | Mutlugun et al. |
| 2015/0218444 | A1 | 8/2015 | Kang et al. |
| 2015/0315460 | A1 | 11/2015 | Gim et al. |
| 2016/0005932 | A1 | 1/2016 | Lee et al. |
| 2017/0082892 | A1 | 3/2017 | Chung |
| 2017/0183565 | A1 | 6/2017 | Jun et al. |
| 2018/0105739 | A1 | 4/2018 | Kim et al. |
| 2018/0142149 | A1 | 5/2018 | Youn et al. |
| 2018/0148638 | A1 | 5/2018 | Ahn et al. |
| 2018/0157124 | A1 | 6/2018 | Han et al. |

FOREIGN PATENT DOCUMENTS

| | | |
|---|---|---|
| KR | 2016-0043666 A | 4/2016 |
| KR | 2017-0034055 A | 3/2017 |
| KR | 2017-0072418 A | 6/2017 |
| KR | 2018-0043748 A | 4/2018 |
| KR | 2018-0058208 A | 5/2018 |
| KR | 2018-0059724 A | 6/2018 |
| WO | 2017/116820 A1 | 7/2017 |

OTHER PUBLICATIONS

Duncan Gregory et al. "Synthetic Solid State Chemistry", Dalton Transactions, 2010, 39, 26, 6021-6023 (4 pages).

Hiroji Hosokawa et al. "Surface modifcations of CdS quantum dots with fluorinated thiophenol", J. Chem. Soc., Faraday Trans., 1996, 92(22), 4575-4580 (6 pages).

Liang Huang et al. "Organosilane micellization for direct encapsulation of hydrophobic quantum dots into silica beads with highly preserved fluorescence", Chem. Commun., 2012, 48, 6145-6147.

Repeating the Patterning Process three times

QUANTUM DOT COMPOSITION, QUANTUM DOT POLYMER COMPOSITE, AND LAYERED STRUCTURE AND ELECTRONIC DEVICES INCLUDING THE SAME

CROSS-REFERENCE TO RELATED APPLICATION

This application claims priority to Korean Patent Application No. 10-2017-0145916, filed in the Korean Intellectual Property Office on Nov. 3, 2017, and all the benefits accruing therefrom under 35 U.S.C. § 119, the content of which is incorporated herein in its entirety by reference.

BACKGROUND

1. Field

A quantum dot composition, a composite prepared therefrom, and a layered structure and an electronic device including the same are disclosed.

2. Description of the Related Art

Quantum dots (e.g., nano-sized semiconductor nanocrystals) having different energy bandgaps may be obtained by controlling their sizes and compositions. Such quantum dots may emit light having various wavelengths. In a colloidal synthesis, organic materials such as a dispersing agent or a solvent may coordinate, e.g., be bound, to a surface of the semiconductor during the growth thereof. As a result, quantum dots having a controlled size and desired luminous properties and stabilities may be prepared.

However, there remains a need in compositions for preparing quantum dot composites having improved process stability.

SUMMARY

An embodiment is related to a composition for preparing a quantum dot polymer composite capable of achieving improved process stability.

An embodiment is related to a quantum dot complex prepared therefrom.

An embodiment is related to a quantum dot polymer composite or a pattern thereof prepared from the composition of the embodiments.

An embodiment provides an electronic device including the quantum dot-polymer composite or the pattern thereof.

In an embodiment, a quantum dot composition includes:
a quantum dot,
a metal thiolate complex compound, and
a solvent (e.g., an organic solvent).

The metal thiolate complex compound includes a hydrophobic moiety, a thioether moiety (—S—), and a polyvalent metal. The hydrophobic moiety includes a fluorinated organic group (e.g., a perfluoro hydrocarbon group), a multi-aromatic ring-containing group having a backbone structure that includes a quaternary carbon atom, which is a part of a cyclic group, and two aromatic rings bound to the quaternary carbon atom, or a combination thereof.

The metal thiolate complex compound may be bound to a surface of the quantum dot, thereby being present as a part of a quantum dot complex.

The polyvalent metal may include Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof.

The metal thiolate complex compound may include a dithiolene moiety (also referred to as a dithiolate moiety) represented by *—S-M-S—* (wherein * is a portion linked to an atom constituting the metal thiolate complex compound).

In the metal thiolate complex compound, the polyvalent metal may be directly linked to the thioether moiety.

The polyvalent metal may bind the metal thiolate complex compound to the quantum dot (e.g., a surface of the quantum dot).

The metal thiolate complex compound may be represented by Chemical Formula 1:

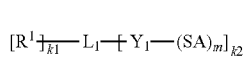

Chemical Formula 1 wherein,
$R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group, a hydroxy group; —$NH_2$; a substituted or unsubstituted —$NR^aR^{a1}$, wherein $R^a$ and $R^{a1}$ are the same or different, and are independently hydrogen or a C1 to C30 linear or branched alkyl group, and provided that $R^a$ and $R^{a1}$ are not both hydrogen simultaneously; an isocyanate group; a halogen; —$R^bOR^{b1}$ wherein $R^b$ is a substituted or unsubstituted C1 to C20 alkylene group and $R^{b1}$ is hydrogen or a C1 to C20 linear or branched alkyl group; an acyl halide group; —C(=O)$OR^{c1}$ wherein $R^{c1}$ is hydrogen or a C1 to C20 linear or branched alkyl group; —CN; —C(=O)$ONR^dR^{d1}$ wherein $R^d$ and $R^{d1}$ are the same or different, and are independently hydrogen or a C1 to C20 linear or branched alkyl group; or a combination thereof, $L_1$ is a carbon atom, a substituted or unsubstituted C2 to C30 alkylene group; a substituted or unsubstituted C2 to C30 alkylene group having at least one methylene replaced with a sulfonyl group, a carbonyl group, an ether group, a sulfide group, a sulfoxide, an ester group, an amide group, a substituted or unsubstituted C3 to C30 cycloalkylene group; a substituted or unsubstituted C3 to C30 heterocycloalkylene group; a substituted or unsubstituted C6 to C30 arylene group; or a substituted or unsubstituted C3 to C30 heteroarylene group, $Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene is replaced by a sulfonyl group, a carbonyl group, an ether group, a sulfide group, a sulfoxide group, an ester group, an amide group, an imine group, or a combination thereof, A is -M($R^2$)$_{a-1}$, —CR=$CR^3$—$Y_2$—$R^4$, or —CHCH$R^3$—$Y_2$—$R^4$, wherein R is hydrogen or a methyl group, M is Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof, a is a valance of the M, $R^2$ is a group selected from a thiolate containing organic group, a halide, a (meth)acrylate group, a dialkyldithiocarbamate group, an acetate group, a propionate group, a butyrate group, a valerate group, and a carboxy ethyl acrylate group, $R^3$ is hydrogen, —COOH, or a C1 to C10 alkyl group, $Y_2$ is a single bond, a substituted or unsubstituted C1 to C10 alkylene group, a sulfonyl group, a carbonyl group, an ether group, a sulfide group, a sulfoxide group, an ester group, an amide group, an imine group, or a combination thereof, and $R^4$ is a fluorinated organic group or a multi-aromatic ring-containing group having a backbone structure that includes a quaternary carbon atom, which is a part of a cyclic group, and two aromatic rings bound to the quaternary carbon atom, provided that at least one of the A is -$M(R^2)_{a-1}$ and at least one of the A is —CR=$CR^3$—$Y_2$—$R^4$ or —CHCH$R^3$—$Y_2$—$R^4$ m is an integer of at least 1, k1 is 0 or an integer of 1 or more and k2 is an integer of 1 or more, the sum of m and k2 is an integer of greater than or equal to 3, m does not exceed the valence of $Y_1$; and the sum of k1 and k2 does not exceed the valence of $L_1$.

In Chemical Formula 1, $Y_2$ may be an ester group.

The fluorinated organic group may be a fluorinated (or perfluorinated) hydrocarbon group.

The fluorinated hydrocarbon group may be a linear or branched C1 to C50 hydrocarbon group.

The fluorinated hydrocarbon group may be a C1 to C50 fluorinated linear or branched alkyl group or a C2 to C50 fluorinated linear or branched alkenyl group.

The backbone structure of the multi-aromatic ring-containing group may be a moiety represented by Chemical Formula A:

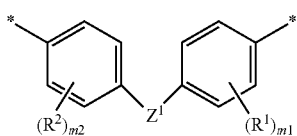

Chemical Formula A wherein

* indicates a portion that is linked to an adjacent atom, each of $R^1$ and $R^2$ is independently hydrogen, a halogen (e.g., F, Cl, Br, I), or a substituted or unsubstituted C1 to C20 alkyl group, m1 and m2 are the same or different, and are independently an integer ranging from 0 to 4, $Z^1$ is a linking moiety represented by any one of Chemical Formulae A-1 to A-6, and in Chemical Formulae A-1 to A-6, * indicates a portion that is linked to an adjacent atom in the aromatic ring:

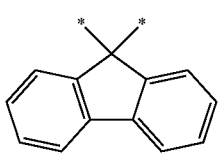

Chemical Formula A-1

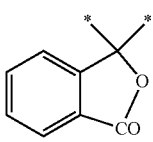

Chemical Formula A-2

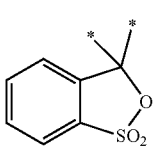

Chemical Formula A-3

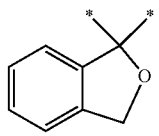

Chemical Formula A-4

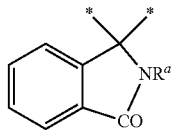

Chemical Formula A-5 wherein $R^a$ is hydrogen, an ethyl group, —$C_2H_4Cl$, —$C_2H_4OH$, —$CH_2CH$=$CH_2$, or a phenyl group,

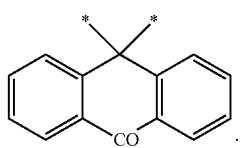

Chemical Formula A-6

The metal thiolate complex compound may be represented by Chemical Formula 1-1:

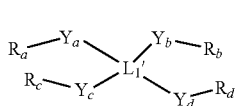

Chemical Formula 1-1 wherein $L_1'$ is carbon; a substituted or unsubstituted C2 to C30 alkylene group; a substituted or unsubstituted C2 to C30 alkylene group having at least one methylene replaced with a sulfonyl group, a carbonyl group, an ether group, a sulfide group, a sulfoxide, an ester group, an amide group, or a combination thereof; a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_a$ to $Y_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene is replaced by a sulfonyl group, a carbonyl group, an ether group, a sulfide group, a sulfoxide group, an ester group, an amide group, an imine group, or a combination thereof, and each of $R_a$ to $R_d$ is independently $R^1$ of Chemical Formula 1 or *-SA, provided that at least two of them are *-SA, wherein A is -$M(R^2)_{a-1}$, —CR=$CR^3$—$Y_2$—$R^4$, or —CHCH$R^3$—$Y_2$—$R^4$ (wherein M is Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof, a is a valance of the M, R is hydrogen or a methyl group, $R^2$ is a group selected from a thiolate containing organic group, a halide, a (meth)acrylate group, a dialkyldithiocarbamate group, an acetate group, a propionate group, a butyrate group, a valerate group, and a carboxy ethyl acrylate group, $R^3$ is hydrogen, —COOH, or a C1 to C10 alkyl group, $Y_2$ is a single bond, a substituted or unsubstituted C1 to C10 alkylene group, a sulfonyl group, a carbonyl group, an ether group, a sulfide group, a sulfoxide group, an ester group, an amide group, an imine group, or a combination thereof, and $R^4$ is a fluorinated organic group or a multi-aromatic ring-containing group having a backbone structure that includes a quaternary carbon atom, which is a part of a cyclic group, and two aromatic rings bound to the quaternary carbon atom, provided that in the compound represented by Chemical Formula 1-1, at least one of the A is -$M(R^2)_{a-1}$ and at least one of the A is —CR=$CR^3$—$Y_2$—$R^4$ or —CHR$CR^3$—$Y_2$—$R^4$.

The metal thiolate complex compound may include a moiety represented by Chemical Formula 1-1-1:

Chemical Formula 1-1-1

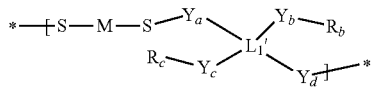

wherein

M is Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof, $L_1'$ is carbon; a substituted or unsubstituted C2 to C30 alkylene group; a substituted or unsubstituted C2 to C30 alkylene group having at least one methylene replaced with a sulfonyl group, a carbonyl group, an ether group, a sulfide group, a sulfoxide group, an ester group, an amide group, or a combination thereof; a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_a$ to $Y_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene is replaced by a sulfonyl group, a carbonyl group, an ether group, a sulfide group, a sulfoxide group, an ester group, an amide group, an imine group, or a combination thereof, and each of $R_b$ and $R_c$ is independently $R^1$ of Chemical Formula 1 or SA, provided that at least one of them is SA, A is -$M(R^2)_{a-1}$, —CR=$CR^3$—$Y_2$—$R^4$, or —CHR$CR^3$—$Y_2$—$R^4$ (wherein R is hydrogen or a methyl group, M is the same as defined above, a is a valance of the M, $R^2$ is a group selected from a thiolate-containing organic group, a halide, a (meth)acrylate group, a dialkyldithiocarbamate group, an acetate group, a propionate group, a butyrate group, a valerate group, and a carboxy ethyl acrylate group, $R^3$ is hydrogen, —COOH, or a C1 to C10 alkyl group, $Y_2$ is a single bond, a substituted or unsubstituted C1 to C10 divalent alkylene group, a sulfonyl group, a carbonyl group, an ether group, a sulfide group, a sulfoxide group, an ester group, an amide group, or a combination thereof, and $R^4$ is a fluorinated organic group or a multi-aromatic ring-containing group having a backbone structure that includes a quaternary carbon atom, which is a part of a cyclic group, and two aromatic rings bound to the quaternary carbon atom, provided that at least one of the A is —CR=$CR^3$—$Y_2$—$R^4$ or —CHR$CR^3$—$Y_2$—$R^4$,

* indicates a portion that is linked to an adjacent atom in the aromatic ring.

The metal thiolate complex compound may include a reaction product among a thiol compound having at least two thiol groups (e.g., at its terminal end), an ene compound having the hydrophobic moiety and the carbon-carbon double bond, and a metal salt including the aforementioned metal.

The thiol compound may include glycol di-3-mercaptopropionate, glycol dimercaptoacetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

The ene compound may include a mono (meth)acrylate compound having the hydrophobic moiety, a mono(meth) acrylic acid having the hydrophobic moiety, a multi aromatic ring containing compound having two (meth)acryloyl moiety, a mono vinyl acetate compound having the hydrophobic moiety, a monovinyl compound having the hydrophobic moiety, or a combination thereof.

The metal salt may include a zinc halide, an indium halide, or a combination thereof.

The metal thiolate complex compound may have a weight average molecular weight of greater than or equal to about 200 Daltons (or g/mol).

The metal thiolate complex compound may have a weight average molecular weight of less than or equal to about 5,000 Daltons.

The quantum dot may include a Group II-VI compound, a Group III-V compound, a Group IV-VI compound, a Group IV element or compound, a Group I-III-VI compound, a Group I-II-IV-VI compound, or a combination thereof.

The quantum dot may include a core including a first semiconductor nanocrystal and a shell disposed on the core and including a second semiconductor nanocrystal.

The polyvalent metal may include the same metal as a metal present at a surface of the quantum dot.

The quantum dot may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are the same or different, and are independently a C1 to C24 aliphatic hydrocarbon group or a C5 to C20 aromatic hydrocarbon group), or a combination thereof.

The composition may further include a binder polymer, a (photo-) polymerizable monomer, an (photo)initiator, or a combination thereof.

The binder polymer may have an acid value of greater than or equal to about 50 milligrams of KOH per gram of the polymer (mg KOH/g) and less than or equal to about 240 mg KOH/g.

The binder polymer may include:

a copolymer of a monomer combination including a first monomer having a carboxylic acid group and a carbon-carbon double bond, a second monomer having a carbon-carbon double bond and a hydrophobic moiety and not having a carboxylic acid group, and optionally, a third monomer having a carbon-carbon double bond and a hydrophilic moiety and not having a carboxylic acid group;

a multi-aromatic ring-containing polymer including a carboxylic acid group (—COOH) and having a backbone structure in a main chain (e.g., a backbone structure incorporated in the main chain), wherein the backbone structure includes a quaternary carbon atom, which is a part of a cyclic group, and two aromatic rings bound to the quaternary carbon atom;

or a combination thereof.

The copolymer may include a first repeating unit derived from the first monomer, a second repeating unit derived from the second monomer, and optionally, a third repeating unit derived from the third monomer.

A solid content of the composition may be greater than or equal to about 1 percent by weight and less than or equal to about 90 percent by weight.

In some embodiments, a quantum dot polymer composite may include a polymer matrix; and a plurality of quantum dots and the aforementioned metal thiolate complex compound dispersed in the polymer matrix.

The polymer matrix may include a thiol-ene polymer, a (meth)acrylate polymer, a urethane polymer, an epoxy polymer, a vinyl polymer, a silicone polymer, or a combination thereof.

The polymer matrix may include a crosslinked polymer and a polymer including a carboxylic acid group.

The crosslinked polymer may include a thiol-ene polymer, a crosslinked poly(meth)acrylate, or a combination thereof.

In some embodiments, a layered structure may include a (e.g., transparent) substrate and a luminescent layer disposed on the substrate, wherein the luminescent layer include at least one repeating section that emits light of a predetermined wavelength and the repeating section include a quantum dot polymer composite.

The repeating section may include a first repeating section emitting a first light and/or a second repeating section emitting a second light, wherein a maximum peak wavelength of the second light is different from that of the first light. The luminescent layer may further include a third repeating section that emits a third light wherein a maximum peak wavelength of the third light is different from those of the first light and the second light.

In embodiments, a display device includes the aforementioned layered structure and a light source configured to provide incident light to the layered structure (e.g., the luminescent layer of the layered structure).

The light source may include at least one light emitting device (e.g., a light emitting diode).

The light source may include a backlight unit including a light emitting device and optionally a light guide panel.

The display device may include a lower substrate and a liquid crystal layer.

The liquid crystal layer may be present between the lower substrate and the layered structure, wherein the luminescent layer of the layered structure faces the liquid crystal layer.

The quantum dot composition or quantum dot complex of the embodiment and a quantum dot polymer composite prepared by using the same may exhibit improved process stability.

BRIEF DESCRIPTION OF THE DRAWINGS

These and/or other aspects will become apparent and more readily appreciated from the following description of the embodiments, taken in conjunction with the accompanying drawings in which.

DETAILED DESCRIPTION

Figure 1:
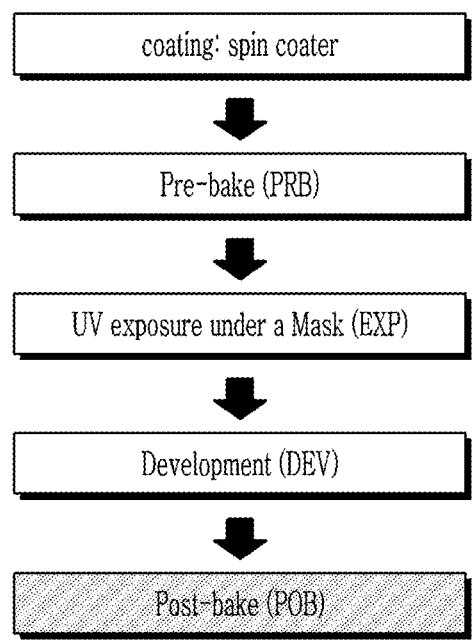
FIG. 1 is a schematic diagram illustrating an exemplary embodiment of a method of producing a quantum dot polymer composite pattern.
Figure 1:
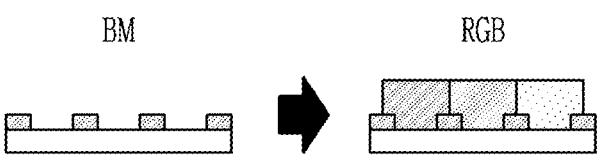

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

As used herein, when a definition is not otherwise provided, the term "substituted" refers to a compound or a group or a moiety wherein at least one of hydrogen atoms thereof is substituted with a substituent including a C1 to C30 alkyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N₃), an amidino group (—C(=NH)NH₂), a hydrazino group (—NHNH₂), a hydrazono group (=N(NH₂)), an aldehyde group (—C(=O)H), a carbamoyl group (—C(O)NH₂), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO₃H) or a salt thereof (—SO₃M, wherein M is an organic or inorganic cation), a phosphoric acid group (—PO₃H₂) or a salt thereof (—PO₃MH or —PO₃M₂, wherein M is an organic or inorganic cation), or a combination thereof.

As used herein, when a definition is not otherwise provided, the term "monovalent organic functional group" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" refers to inclusion of at least one (e.g., one to three) heteroatom(s) including N, O, S, Si, or P.

As used herein, when a definition is not otherwise provided, the term "alkylene group" refers to a straight or branched saturated aliphatic hydrocarbon group having a valence of at least two, optionally substituted with one or more substituents. As used herein, when a definition is not otherwise provided, the term "arylene group" refers to a functional group having a valence of at least two obtained by removal of at least two hydrogens in an aromatic ring, optionally substituted with one or more substituents.

As used herein, when a definition is not otherwise provided, the term "aliphatic organic group" includes a C1 to C30 linear or branched alkyl group, C2 to C30 linear or branched alkenyl group, and C2 to C30 linear or branched alkynyl group, the term "aromatic organic group" includes a C6 to C30 aryl group or a C2 to C30 heteroaryl group, and the term "alicyclic organic group" includes a C3 to C30 cycloalkyl group, a C3 to C30 cycloalkenyl group, and a C3 to C30 cycloalkynyl group.

As used herein, when a definition is not otherwise provided, the term "(meth)acrylate" refers to acrylate and/or methacrylate.

As used herein, when a definition is not otherwise provided, the term "dispersion" may refer to a dispersion, wherein a dispersed phase is a solid including a quantum dot and a continuous phase includes a liquid. For example, in the specification, the term "dispersion" may refer to a colloidal dispersion wherein the dispersed phase has a dimension of greater than or equal to about 1 nanometers (nm) (e.g., greater than or equal to about 2 nm, greater than or equal to about 3 nm, greater than or equal to about 4 nm, or greater than or equal to about 5 nm and less than or equal to about several micrometers (μm) (e.g., less than or equal to about 2 μm, less than or equal to about 1 μm, less than or equal to about 900 nm, less than or equal to about 800 nm, less than or equal to about 700 nm, less than or equal to about 600 nm, or less than or equal to about 500 nm) The dispersion may be a colloidal dispersion.

As used herein, when a definition is not otherwise provided, the term "Group" in the term Group III, Group II, and the like refers to a group of Periodic Table of Elements.

As used herein, when a definition is not otherwise provided, "Group II" refers to Group IIA and Group IIB, and examples of Group III metal may be Cd, Zn, Hg and Mg but are not limited thereto.

As used herein, when a definition is not otherwise provided, "Group III" refers to Group IIIA and Group IIIB, and examples of Group III metal may be Al, In, Ga, and Tl, but are not limited thereto.

As used herein, when a definition is not otherwise provided, "Group IV" refers to Group IVA and Group IVB, and examples of a Group IV metal may be Si, Ge, and Sn, but are not limited thereto. As used herein, the term "metal" may include a semi-metal such as Si.

As used herein, when a definition is not otherwise provided, "Group I" refers to Group IA and Group IB, and examples may include Li, Na, K, Rb, and Cs, but are not limited thereto.

As used herein, when a definition is not otherwise provided, "Group V" refers to Group VA, and examples may include N, P, As, Sb, and Bi, but are not limited thereto.

As used herein, when a definition is not otherwise provided, "Group VI" refers to Group VIA, and examples may include S, Se, and Te, but are not limited thereto.

The luminous properties of the nano-sized quantum dots are susceptible to the external environment. Thus, in order to be applied in various electronic devices such as different display devices and lighting devices, the quantum dots are mixed with (e.g., dispersed in) a solid state matrix (e.g., a polymer matrix) to form a quantum dot polymer composite. The mixing of the quantum dot or the preparation processes of the device including the same may involve some processes such as a heat-treatment that may adversely affect the inherent luminous properties of the quantum dots. Thus, there remains a need to develop a technology for mixing a quantum dot into a medium or fabricating a device including the same without involving deterioration of inherent properties of the quantum dots.

A composition of an embodiment includes a quantum dot (hereinafter, also referred to as a semiconductor nanocrystal), a metal thiolate complex compound, and a solvent. The metal thiolate complex compound may be present in the composition as being bound (e.g., attached) to a surface of the quantum dot to form a quantum dot complex. For example, the composition may include a quantum dot encapped with a metal thiolate complex compound. As used herein, the expression "being bound (attached) to a surface of a quantum dot" may refer to a case where a given compound does not separated (e.g., detached) from the quantum dot when the quantum dot including the given compound bound thereto is dispersed in an organic solvent for dispersing the quantum dots (such as cyclohexyl acetate, propylene glycol monomethyl ether acetate (PGMEA), chloroform, dichloroethane, toluene, or the like) after a preparation process therefor (e.g., including precipitation with using a non-solvent and separation). In an embodiment, the composition may not include an absorption type dye, an absorption type pigment, or a combination thereof. In an embodiment, the composition may include an absorption type dye, an absorption type pigment, or a combination thereof.

The metal thiolate complex compound includes a hydrophobic moiety, a thioether moiety (—S—), and a polyvalent metal.

The polyvalent metal may form a divalent or higher (e.g., trivalent or tetra valent) cation. The polyvalent metal include Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof. In some embodiments, the polyvalent metal may include zinc, indium, aluminum, or a combination thereof.

In the metal thiolate complex compound, the polyvalent metal may be directly linked to the thioether moiety (—S—). The metal may bind the metal thiolate complex compound to the quantum dot (e.g., a surface of the quantum dot). The metal thiolate complex compound may include a dithiolene moiety represented by *—S-M-S—* (wherein * is a portion linked to an atom constituting the metal thiolate complex compound).

The metal thiolate complex compound may be represented by Chemical Formula 1:

Chemical Formula 1

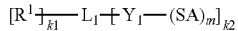

wherein, $R^1$ is hydrogen, a substituted or unsubstituted C1 to C30 linear or branched alkyl group, a substituted or unsubstituted C6 to C30 aryl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, —$NH_2$, a substituted or unsubstituted C1 to C30 amine group (—NRR', wherein R and R' are the same or different, and are independently hydrogen or a C1 to C30 linear or branched alkyl group, and provided that R and R' are not hydrogen simultaneously), an isocyanate group, a halogen, —ROR' (wherein R is a substituted or unsubstituted C1 to C20 alkylene group and R' is hydrogen or a C1 to C20 linear or branched alkyl group), an acyl halide group (—RC(=O)X, wherein R is a substituted or unsubstituted C1 to C20 alkylene group and X is a halogen), —C(=O)OR' (wherein R' is hydrogen or a C1 to C20 linear or branched alkyl group), —CN, —C(=O)ONRR' (wherein R and R' are the same or different, and are independently hydrogen or a C1 to C20 linear or branched alkyl group), or a combination thereof, $L_1$ is a carbon atom, a substituted or unsubstituted C2 to C30 alkylene group, a substituted or unsubstituted C2 to C30 alkylene group having at least one methylene (—$CH_2$—) replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, a substituted or unsubstituted C3 to C30 cycloalkylene group, a substituted or unsubstituted C3 to C30 heterocycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 alkyl group), or a combination thereof, A is -M($R^2$)$_{a-1}$, —CR=$CR^3$—$Y_2$—$R^4$, or —CHR$CHR^3$—$Y_2$—$R^4$, wherein R is hydrogen or a methyl group, M is Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof, a is a valance of the M, $R^2$ is a group selected from a thiolate containing organic group, a halide, a (meth)acrylate group, a dialkyldithiocarbamate group, an acetate group, a propionate group, a butyrate group, a valerate group, and a carboxy ethyl acrylate group, $R^3$ is hydrogen, —COOH, or a C1 to C10 alkyl group, $Y_2$ is a single bond, a substituted or unsubstituted C1 to C10 (e.g., divalent) alkylene group, a sulfonyl group (—S(=O)$_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), an imine group (—NR—) (wherein R is hydrogen or a C1 to C10 alkyl group), or a combination thereof, and $R^4$ is a fluorinated organic group or a multiaromatic ring-containing group having a backbone structure that includes a quaternary carbon atom, which is a part of a cyclic group, and two aromatic rings bound to the quaternary carbon atom, provided that at least one of the A is -M($R^2$)$_{a-1}$ and at least one of the A is —CR=$CR^3$—$Y_2$—$R^4$ or —CHR$CHR^3$—$Y_2$—$R^4$, m is an integer of at least 1 (e.g., 1, 2, or 3), k1 is 0 or an integer of 1 or more (e.g., 1, 2, or 3) and k2 is an integer of 1 or more (e.g., 1, 2, or 3), the sum of m and k2 is an integer of greater than or equal to 3, m does not exceed the valence of $Y_1$; and the sum of k1 and k2 does not exceed the valence of $L_1$.

The carboxylethyl acrylate has the following structure, as known in the art:

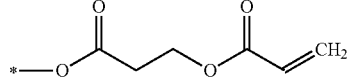

In the chemical formula for the metal thiolate complex compound, the $Y_2$ may be a combination of a C1 to C10 alkylene group and at least one of a sulfonyl group (—S(=O)$_2$—), a carbonyl group (—C(=O)—), an ether group (—O—), a sulfide group (—S—), a sulfoxide group (—S(=O)—), an ester group (—C(=O)O—), and an amide group (—C(=O)NR—) (wherein R is hydrogen or a C1 to C10 linear or branched alkyl group). In the chemical formula for the metal thiolate complex compound, $Y_2$ may be a single bond.

In some embodiments, the $R^1$ of Chemical Formula 1 may be hydrogen, a C1 to C30 linear or branched alkyl group, a hydroxyl group, or a C1 to C30 linear or branched alkyl group substituted with a C1 to C30 linear or branched alkyl group, a hydroxyl group, or a combination thereof.

In some embodiments, the $L_1$ of Chemical Formula 1 may be a carbon atom, a substituted or unsubstituted C2 to C30 alkylene group, a substituted or unsubstituted C3 to C30 cycloalkylene or cycloalkenylene group (e.g., cyclohexane moiety, a norbornene moiety, a norbornane moiety, a dicycloalkane moiety, a tricycloalkane moiety, or the like), a substituted or unsubstituted C6 to C30 arylene group (an arene moiety or a naphthalene moiety), a substituted or unsubstituted C3 to C30 heteroarylene group, or a substituted or unsubstituted C3 to C30 heterocycloalkylene group.

In some embodiments, the $Y_1$ of Chemical Formula 1 may be a single bond, a C1 to C30 divalent alkylene group, a C2 to C30 alkenylene group, or a C1 to C30 alkylene group or a C2 to C30 alkenylene group wherein at least one methylene (—$CH_2$—) is replaced by sulfonyl (—$S(=O)_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof.

In some embodiments, the thiolate containing organic group for the $R^2$ may include a moiety represented by Chemical Formula 1-A:

Chemical Formula 1-A

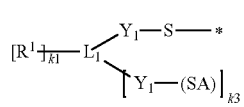

$R^1$, k1, $L_1$, and $Y_1$ are the same as defined in Chemical Formula 1, k3 is 0 or an integer of at least 1 (e.g., 0, 1, 2, 3, or 4)

the sum of k1 and k3 is less than the valence of the $L_1$,

A is -$M(R^2)_{a-1}$, —CR=$CR^3$—$Y_2$—$R^4$, or —CHR$CHR^3$—$Y_2$—$R^4$, wherein R, M, a, $R^2$, $R^3$, $Y_2$, and $R^4$ are the same as set forth in Chemical Formula 1,

* is a portion linked to an adjacent polyvalent metal M.

In the above formula, $Y_2$ may be at least one (or a combination of at least two) of a single bond, a C1 to C10 alkylene group, a sulfonyl group (—$S(=O)_2$—), a carbonyl group (—C(=O)—), an ether group (—O—), a sulfide group (—S—), a sulfoxide group (—S(=O)—), an ester group (—C(=O)O—), an amide group (—C(=O)NR—) (wherein R is hydrogen or a C1 to C10 linear or branched alkyl group), imine (—NR—) (wherein R is hydrogen or a C1 to C10 alkyl group), or a combination thereof, The hydrophobic moiety of the metal thiolate complex compound may include a fluorinated organic group (e.g., a perfluoro hydrocarbon group); a multi-aromatic ring-containing group having a backbone structure that includes a quaternary carbon atom, which is a part of a cyclic group, and two aromatic rings bound to the quaternary carbon atom; or a combination thereof.

When the metal thiolate complex compound includes the aforementioned hydrophobic moiety, the composition may secure an improved re-solubility during a patterning process for producing a quantum dot polymer composite, thereby forming a pattern that has a cross-section without any substantial defect such as an undercut.

The fluorinated organic group may include a fluorinated hydrocarbon group having a carbon number of greater than or equal to one, (for example greater than or equal to two or greater than or equal to three). The fluorinated hydrocarbon group may include a C1 to C50 fluorinated (e.g., perfluorinated) linear or branched alkyl group (e.g., trifluoromethyl group). In some embodiments, the fluorinated hydrocarbon group may include a linear or branched monovalent hydrocarbon group (e.g., an alkyl, an alkenyl, or an alkynyl) including carbon atoms of 2 to 50 (e.g., carbon atoms of greater than or equal to 2, greater than or equal to 3, greater than or equal to 4, greater than or equal to 5, greater than or equal to 6, greater than or equal to 7, greater than or equal to 8, greater than or equal to 9, or greater than or equal to 10 and less than or equal to 50, less than or equal to 40, less than or equal to 30, less than or equal to 20, or less than or equal to 15). The fluorinated hydrocarbon group may be a per-fluorinated hydrocarbon (e.g., alkyl) group. The fluorinated hydrocarbon group may be represented by the following formula:

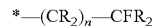

wherein R is the same or different and each independently, hydrogen, fluorine, a C1 to C3 alkyl group, or a C1 to C3 fluorinated (e.g., perfluorinated) alkyl group (e.g., trifluoromethyl group), n is an integer of 0 to 20.

The backbone structure of the multi-aromatic ring-containing group may include a moiety represented by Chemical Formula A:

Chemical Formula A

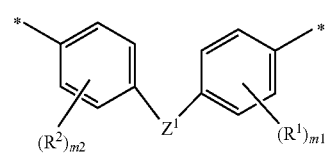

wherein

* indicates a portion that is linked to an adjacent atom, each of $R^1$ and $R^2$ is independently hydrogen, a halogen, or a substituted or unsubstituted C1 to C20 alkyl group, m1 and m2 are the same or different, and are independently an integer ranging from 0 to 4, $Z^1$ is a linking moiety represented by any one of Chemical Formulae A-1 to A-6, and in Chemical Formulae A-1 to A-6, * indicates a portion that is linked to an adjacent atom in the aromatic ring:

Chemical Formula A-1

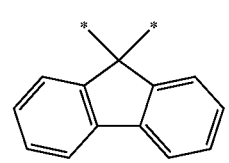

Chemical Formula A-2

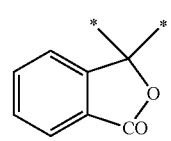

Chemical Formula A-3

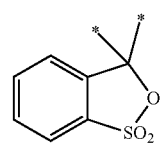

Chemical Formula A-4

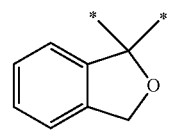

Chemical Formula A-5

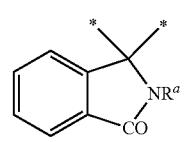

wherein $R_a$ is hydrogen, an ethyl group, —$C_2H_4Cl$, —$C_2H_4OH$, —$CH_2CH=CH_2$, or a phenyl group, Chemical Formula A-6

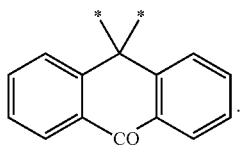

The metal thiolate complex compound may include a reaction product among a multi-thiol compound having at least two thiol groups (e.g., at its terminal end), an ene compound having the hydrophobic moiety and the carbon-carbon double bond, and a metal salt including the aforementioned metal.

The multi-thiol compound may be represented by Chemical Formula 6:

Chemical Formula 6

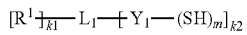

wherein $R^1$ includes hydrogen, a substituted or unsubstituted C1 to C30 linear or branched alkyl group, a substituted or unsubstituted C6 to C30 aryl group, a substituted or unsubstituted C7 to C30 arylalkyl group, a substituted or unsubstituted C3 to C30 heteroaryl group, a substituted or unsubstituted C3 to C30 cycloalkyl group, a substituted or unsubstituted C3 to C30 heterocycloalkyl group, a C1 to C10 alkoxy group, a hydroxy group, $-NH_2$, a substituted or unsubstituted C1 to C30 amine group ($-NRR'$, wherein R and R' are the same or different, and are independently hydrogen or a C1 to C30 linear or branched alkyl group, and provided that R and R' are not hydrogen simultaneously); an isocyanate group; a halogen; $-ROR'$ (wherein R is a substituted or unsubstituted C1 to C20 alkylene group and R' is hydrogen or a C1 to C20 linear or branched alkyl group); an acyl halide group ($-RC(=O)X$, wherein R is a substituted or unsubstituted C1 to C20 alkylene group and X is a halogen), $-C(=O)OR'$ (wherein R' is hydrogen or a C1 to C20 linear or branched alkyl group), $-CN$, $-C(=O)ONRR'$ (wherein R and R' are the same or different, and are independently hydrogen or a C1 to C20 linear or branched alkyl group), or a combination thereof, $L_1$ includes a carbon atom, a substituted or unsubstituted C1 to C30 alkylene group, a substituted or unsubstituted C3 to C30 cycloalkylene group, a substituted or unsubstituted C6 to C30 arylene group, a substituted or unsubstituted C3 to C30 heteroarylene group, a substituted or unsubstituted C3 to C30 heterocycloalkylene group, wherein at least one methylene ($-CH_2-$) of the substituted or unsubstituted C1 to C30 alkylene group may be replaced by sulfonyl ($-S(=O)_2-$), carbonyl ($-C(=O)-$), ether ($-O-$), sulfide ($-S-$), sulfoxide ($-S(=O)-$), ester ($-C(=O)O-$), amide ($-C(=O)NR-$) (wherein R is hydrogen or a C1 to C10 alkyl group), or a combination thereof, $Y_1$ includes a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene ($-CH_2-$) is replaced by sulfonyl ($-S(=O)_2-$), carbonyl ($-C(=O)-$), ether ($-O-$), sulfide ($-S-$), sulfoxide ($-S(=O)-$), ester ($-C(=O)O-$), amide ($-C(=O)NR-$) (wherein R is hydrogen or a C1 to C10 linear or branched alkyl group), imine ($-NR-$) (wherein R is hydrogen or a C1 to C10 linear or branched alkyl group), or a combination thereof, m is an integer of 1 or more, k1 is 0 or an integer of 1 or more, k2 is an integer of 1 or more, and the sum of m and k2 is an integer of 3 or more, provided that m does not exceed the valence of $Y_1$ when $Y_1$ is not a single bond, and provided that the sum of k1 and k2 does not exceed the valence of $L_1$.

The multi-thiol compound may include a compound of Chemical Formula 6-1:

Chemical Formula 6-1

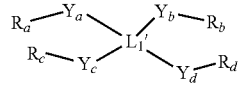

wherein $L_1'$ is carbon, a substituted or unsubstituted C2 to C20 alkylene group, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene ($-CH_2-$) is replaced by sulfonyl ($-S(=O)_2-$), carbonyl ($-C(=O)-$), ether ($-O-$), sulfide ($-S-$), sulfoxide ($-S(=O)-$), ester ($-C(=O)O-$), amide ($-C(=O)NR-$) (wherein R is hydrogen or a C1 to C10 linear or branched alkyl group), imine ($-NR-$) (wherein R is hydrogen or a C1 to C10 linear or branched alkyl group), or a combination thereof, and each of $R_a$ to $R_d$ is independently $R^1$ of Chemical Formula 6 or SH, provided that at least two of them are SH.

The multi-thiol compound may include glycol di-3-mercaptopropionate (e.g., C2 to C10 alkylene glycol di-3-mercaptopropionate, such as ethylene glycol di-3-mercaptopropionate), glycol dimercaptoacetate (e.g., C2 to C10 alkylene glycol dimercaptoacetate, such as ethylene glycol dimercaptoacetate), trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

The metal salt may include a zinc halide (for example, zinc fluoride, zinc chloride, zinc bromide, zinc iodide), an indium halide (for example, indium fluoride, indium chloride, indium bromide, indium iodide), or a combination thereof.

The ene compound may include a mono (meth)acrylate compound having the aforementioned hydrophobic moiety, a mono(meth)acrylic acid having the hydrophobic moiety, a multiaromatic ring containing compound having two (meth)acryloyl moiety (e.g., at its ends), a mono vinyl acetate compound having the aforementioned hydrophobic moiety, a monovinyl compound having the aforementioned hydrophobic moiety, or a combination thereof.

In some embodiments, the ene compound may include a compound represented by any of the following chemical formulae:

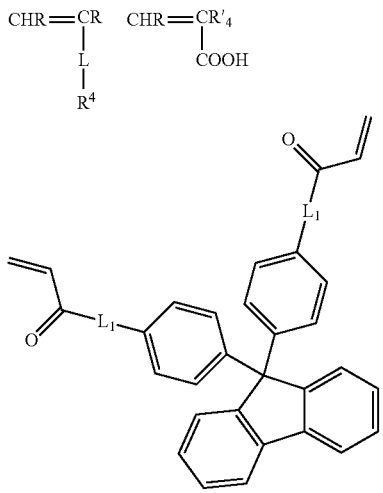

wherein R is hydrogen or methyl, L is a single bond, —COO—, or —OCO—, $L_1$ is each independently —ORO— wherein R is a hydroxyl substituted or unsubstituted C1 to C10 alkylene moiety $R^4$ or $R_4'$ is a fluorinated organic group or a multi-aromatic ring-containing group having a backbone structure that includes a quaternary carbon atom, which is a part of a cyclic group, and two aromatic rings bound to the quaternary carbon atom. Details of the fluorinated organic group and the multi-aromatic ring-containing group are the same as set forth above.

The ene compound may include tetrafluoropropyl (meth)acrylate, hexafluoroisopropyl (meth)acrylate, tridecafluorooctyl(meth)acrylate, pentadecafluoro-n-octyl(meth)acrylate, trifluoromethyl(meth)acrylic acid, bis[(meth)acryloyloxyethyloxy)phenyl]fluorene, or a combination thereof.

The multi-thiol compound, the ene compound, and the metal salt is a commercially available or may be manufactured by any known method.

For example, the ene compound having the aforementioned multi-aromatic ring-containing group may be prepared by reacting an appropriate fluorene derivative (e.g., 9,9-bis[4-(2-hydroxyethoxy)phenyl]fluorene, 9,9-bis(4-hydroxyphenyl)fluorene, 9,9-bis(4-hydroxy-3-methylphenyl)fluorene, or the like) with a compound having an appropriate functional group and a carbon-carbon double bond (e.g., a (meth)acrylic acid compound and the like) or is commercially available. Examples of the ene compound having the aforementioned multi-aromatic ring-containing group may include 9,9-bis[4-(2-acryloyloxyethyloxy)phenyl]fluorene, but is not limited thereto.

The metal thiolate complex compound having a desired chemical structure and a molecular weight may be obtained by adopting appropriate structures of the multi-thiol compound, the ene compound, and the metal salt compound and controlling a mole ratio among them.

Conditions for the reaction among the multi thiol compound, the ene compound, and the metal salt are not particularly limited and appropriately selected considering the types of the reactants and the desired structure and molecular weight of the metal thiolate complex compound. In some embodiments, the reaction may be conducted at a temperature of greater than or equal to about 50° C. and less than or equal to about 80° C., but it is not limited thereto. The reaction may be conducted for a time of greater than or equal to about 10 minutes, for example, greater than or equal to about 30 minutes, greater than or equal to about 40 minutes, or greater than or equal to about 50 minutes, but it is not limited thereto. The reaction may be conducted in an appropriate solvent (e.g., an ester solvent having an aliphatic, alicyclic, and/or an aromatic hydrocarbon group such as cyclohexyl acetate), but it is not limited thereto.

The metal thiolate complex compound may be represented by Chemical Formula 1-1:

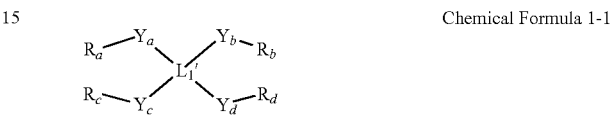

Chemical Formula 1-1 wherein $L_1'$ is carbon, a substituted or unsubstituted C2 to C30 alkylene group, a substituted or unsubstituted C2 to C30 alkylene group having at least one methylene (—$CH_2$—) replaced with sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 alkyl group), or a combination thereof, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—$CH_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_a$ to $R_d$ is independently $R^1$ of Chemical Formula 6 or *-SA, provided that at least two of them are *-SA, A is the same as defined above provided that at least one of the A is -M(R$^2$)$_{a-1}$ and at least one of the A is —CR=CR$^3$—Y$_2$—R$^4$ or —CHRCHR$^3$—Y$_2$—R$^4$.

The metal thiolate complex compound may include a moiety represented by Chemical Formula 1-1-1:

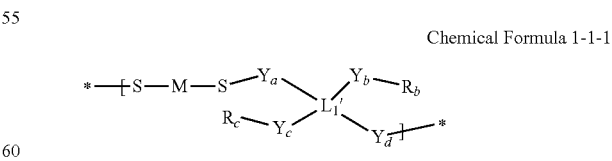

Chemical Formula 1-1-1 wherein $L_1'$ is carbon, a substituted or unsubstituted C2 to C30 alkylene group, a substituted or unsubstituted C2 to C30 alkylene group having at least one methylene (—$CH_2$—) replaced with sulfonyl (—S(=O)$_2$—), carbonyl (—C(=O)—), ether (—O—), sulfide (—S—), sulfoxide (—S (=O)—), ester (—C(=O)O—), amide (—C(=O)NR—) (wherein R is hydrogen or a C1 to C10 alkyl group), or a combination thereof, a substituted or unsubstituted C6 to C30 arylene group, a substituted or unsubstituted C3 to C30 heteroarylene group, a substituted or unsubstituted C3 to C30 cycloalkylene group, or a substituted or unsubstituted C3 to C30 heterocycloalkylene group, $Y_a$ to $Y_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene (—CH$_2$—) is replaced by sulfonyl (—S(=O)$_2$—), carbonyl (—C(=O)—), ether (—O—), sulfide (—S—), sulfoxide (—S(=O)—), ester (—C(=O)O—), amide (—C(=O)NR—) (wherein R is hydrogen or a C1 to C10 linear or branched alkyl group), imine (—NR—) (wherein R is hydrogen or a C1 to C10 linear or branched alkyl group), or a combination thereof, and each of $R_b$ and $R_c$ is independently $R^1$ of Chemical Formula 6 or *-SA, provided that at least two of them are *-SA, A is the same as defined above and at least one of the A is —CR=CR$^3$—Y$_2$—R$^4$ or —CHRCHR$^3$—Y$_2$—R$^4$, M is Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof, and

* indicates a portion that is linked to an adjacent atom.

The metal thiolate complex compound may have a weight average molecular weight of greater than or equal to about 200 Daltons (Da). for example, greater than or equal to about 300 Da, greater than or equal to about 400 Da, greater than or equal to about 500 Da, greater than or equal to about 600 Da, greater than or equal to about 700 Da, greater than or equal to about 800 Da, greater than or equal to about 900 Da. The metal thiolate complex compound may have a weight average molecular weight of less than or equal to about 5,000 Da, for example, less than or equal to about 4,500 Da, less than or equal to about 4,000 Da, less than or equal to about 3,500 Da, or less than or equal to about 3,000 Da.

Quantum dots may emit light with a controlled wavelength by adjusting their composition and/or size and draw attentions as a next generation material (such as a luminous material for a display device). For example, a photoluminescent wavelength of the quantum dot may be present in a range from an ultraviolet region to a near infrared region. For example, the quantum dot may have a photoluminescent peak wavelength (or a photoluminescent center wavelength) that may be present in a range from about 420 nm to about 700 nm. The quantum dot may have a quantum yield of greater than or equal to about 10%, for example, greater than or equal to about 20%, greater than or equal to about 30%, greater than or equal to about 40%, greater than or equal to about 50%, greater than or equal to about 60%, greater than or equal to about 70%, greater than or equal to about 80%, greater than or equal to about 90%, or even about 100%.

The quantum dot may show a photoluminescent spectrum with a relatively narrow full width at half maximum (FWHM). In some embodiments, the quantum dot may have a full width at half maximum (FWHM) of less than or equal to about 45 nm, for example less than or equal to about 40 nm, or less than or equal to about 30 nm. While not wishing to be bound by theory, it is understood that within such ranges, a device including the nanocrystal may have enhanced color purity or improved color reproducibility.

In order for the quantum dots to be used in a device, they may be mixed with an organic and/or inorganic matrix. Such mixing and/or fabrication process for preparing a device may cause serious deterioration in luminous properties that the quantum dots originally have. For example, a mixing with polymer and/or a heat/photo treatment for a preparation of a quantum dot polymer composite may lead to a decrease in a luminous efficiency. Without wishing to be bound by any theory, the mixing and/or the treatment may cause a loss of ligands present on a surface of the quantum dot and this may cause deterioration of properties.

In order to be applied in a device, a quantum dot polymer composite may be required to be patterned. A patterning process (e.g., a photolithography process) may involve a film formation, a development after exposure to light, and a heat-treatment. The patterning process may have strongly adverse effects on luminous properties. Without wishing to be bound by any theory, various treatments involved in the patterning process (e.g., dispersing in a medium, heat treatment, or the like) may cause an organic ligand present on a surface of the quantum dot to be detached therefrom, which may increase the number of defects on a surface of the quantum dot and decrease the luminous efficiency thereof. The defects on the surface of the quantum dot may act as a quenching trap and may become a starting point of the oxidation of the quantum dot.

In addition, currently, most of the quantum dots having properties that can be used in an electronic device are cadmium-based quantum dots. However, cadmium poses serious threats to the health and environment, and thus, is one of the restricted elements in many countries. A Group III-V based quantum dot is a type of a cadmium free quantum dot. However, the stability (e.g., chemical stability, heat stability, and/or photostability) of a cadmium free quantum dot (such as a Group III-V based quantum dot or a quantum dot having a Group III-V core) may be inferior to the cadmium based quantum dots. Thus, in various processes for the application into the electronic device, the luminous properties of the cadmium free quantum dots may significantly deteriorate.

Passivation with an organic compound or an organic/inorganic hybrid compound may be used to prevent or suppress the deterioration of the quantum dot properties. However, the passivation may tend to involve complex processes and cannot provide a desired level of protection for the quantum dot surface. Moreover, the surface modified quantum dots prepared from the passivation may severely aggregate with each other, and thus, their application in a device may be greatly limited.

In some embodiments, the quantum dot composition includes the quantum dot and the aforementioned metal thiolate complex compound, thereby providing improved stability. For example, in the quantum dot composition, the aforementioned metal thiolate complex compound may readily passivate the quantum dot. The metal thiolate complex compound may be bound (or linked) to a surface of the quantum dot and thereby be present as a part of a quantum dot complex. In some embodiments, the aforementioned metal thiolate complex compound may be bound to the surface of the quantum dot via a surface exchange reaction conducted under relatively simple and mild conditions for a relatively short period of time. The obtained quantum dot complex may exhibit improved stability (e.g., chemical and/or thermal stability and the like). In addition, the composition of the embodiments may show enhanced re-dissolubility during a developing step of a patterning process, which makes it possible to realize a production of a large sized pattern.

In some embodiments, the quantum dot composition includes the metal thiolate complex compound (e.g., attached to the surface of the quantum dot), and thus, have a proper viscosity even when it is mixed with a polymer and/or a monomer). When the quantum dot composition is prepared as above, a change of its viscosity over time (e.g., an increase in its viscosity over time) may be suppressed, and thus, the composition may exhibit enhanced storage stability.

In the composition of the embodiments, the aforementioned metal thiolate complex compound may stably passivated the surface of the quantum dot, contributing the improvement of the stability of the quantum dot's luminous properties with respect to external environment. Thus, adopting the composition of the embodiments makes it possible to suppress a decrease in efficiency that may tend to occur otherwise during a process (e.g., a heat-treatment) for producing a device including the quantum dot. By the passivation provided by the metal thiolate complex compound in the composition of the embodiments, in some embodiments, the quantum dot (or the quantum dot complex) may show a 5% weight loss temperature of less than or equal to about 300° C., for example, less than or equal to about 290° C., or less than or equal to about 280° C., as determined by a thermal gravity analysis thereof. In addition, the quantum dot (or quantum dot complex) of the embodiments may include a greater amount of organics when be determined by a thermal gravity analysis (TGA). In some embodiments, after the quantum dot (or quantum dot complex) of the embodiments is washed two times with a non-solvent, it may include organics in an amount of greater than or equal to about 25 wt %, greater than or equal to about 26 wt %, greater than or equal to about 27 wt %, greater than or equal to about 28 wt %, or greater than or equal to about 29 wt %. In contrast, a quantum dot prepared in a conventional wet chemical method may include organics in an amount of 15 wt % to 20 wt %.

In some embodiments, the quantum dot or the quantum dot complex may prepared by conducting a reaction (e.g., a surface exchange reaction) between a colloidal quantum dot prepared in a wet chemical method and the aforementioned metal thiolate complex compound. In some embodiments, the reaction between the quantum dot and the metal thiolate complex compound may be carried out in a relatively mild condition in light of a temperature and a time.

In some embodiments, the surface exchange reaction may be carried out by contacting the aforementioned metal thiolate complex compound with the quantum dot in an organic solvent. The contacting atmosphere, temperature, and time are not particularly limited and may be selected appropriately. For example, the contacting may be carried out in air or in an inert atmosphere. The contacting may be carried out at a temperature of greater than or equal to about 40° C., greater than or equal to about 50° C., greater than or equal to about 55° C. and less than or equal to about 90° C., less than or equal to about 80° C., less than or equal to about 70° C., or less than or equal to about 65° C. for a time period of greater than or equal to about 10 minutes, for example, greater than or equal to about 20 minutes, greater than or equal to about 30 minutes, or greater than or equal to about 40 minutes. In some embodiments, the surface exchange temperature may be in a range from about 40° C. to about 80° C.

In the organic solvent, a concentration of the quantum dot and a concentration of the metal thiolate complex compound may be selected appropriately and are not particularly limited.

The organic solvent may include a halogenated (e.g., chlorinated) hydrocarbon such as chloroform, dichloroethane, or the like, a C6 to C40 substituted or unsubstituted aromatic hydrocarbon such as toluene, xylene, or the like, a C6 to C40 substituted or unsubstituted alicyclic hydrocarbon or derivatives thereof such as cyclohexane, cyclohexyl acetate, or the like, C1 to C10 alcohol such as ethanol, or a combination thereof, but is not limited thereto.

Types of the quantum dot (semiconductor nanocrystal particle) are not particularly limited. The quantum dot may be prepared by any known method or is a commercially available. For example, The quantum dot (e.g., the first semiconductor nanocrystal and/or the second semiconductor nanocrystal) may include a Group II-VI compound, a Group III-V compound, a Group IV-VI compound, a Group IV element or compound, a Group I-III-VI compound, a Group I-II-IV-VI compound, or a combination thereof. In some embodiments, the quantum dot does not include cadmium, lead, mercury, or a combination thereof The Group II-VI compound may include:

a binary element compound including CdSe, CdTe, ZnS, ZnSe, ZnTe, ZnO, HgS, HgSe, HgTe, MgSe, MgS, or a combination thereof;

a ternary element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, or a combination thereof; and a quaternary element compound including HgZnTeS, CdZnSeS, CdZnSeTe, CdZnSTe, CdHgSeS, CdHgSeTe, CdHgSTe, HgZnSeS, HgZnSeTe, HgZnSTe, or a combination thereof.

The Group II-VI compound may further include a Group III metal.

The Group III-V compound may include:

a binary element compound including GaN, GaP, GaAs, GaSb, AlN, AlP, AlAs, AlSb, InN, InP, InAs, InSb, or a combination thereof;

a ternary element compound including GaNP, GaNAs, GaNSb, GaPAs, GaPSb, AlNP, AlNAs, AlNSb, AlPAs, AlPSb, InNP, InNAs, InNSb, InPAs, InPSb, InZnP, or a combination thereof; and a quaternary element compound including GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, or a combination thereof.

The Group III-V compound may further include a Group II metal (e.g., InZnP).

The Group IV-VI compound may include:

a binary element compound including SnS, SnSe, SnTe, PbS, PbSe, PbTe, or a combination thereof;

a ternary element compound including SnSeS, SnSeTe, SnSTe, PbSeS, PbSeTe, PbSTe, SnPbS, SnPbSe, SnPbTe, or a combination thereof; and a quaternary element compound including SnPbSSe, SnPbSeTe, SnPbSTe, or a combination thereof.

Examples of the Group I-III-VI compound may include $CuInSe_2$, $CuInS_2$, CuInGaSe, and CuInGaS, but are not limited thereto.

Examples of the Group I-II-IV-VI compound may include CuZnSnSe and CuZnSnS, but are not limited thereto.

The Group IV element or compound may include:
a single-elementary substance including Si, Ge, or a combination thereof; and
a binary element compound including SiC, SiGe, or a combination thereof.

The binary element compound, the ternary element compound, or the quaternary element compound may be respectively included in a uniform concentration in the same particle or partially different concentrations in the same particle. The quantum dot may include a core including a first semiconductor nanocrystal and a shell disposed on at least a portion (or the entire) of a surface of the core and including a second semiconductor nanocrystal having a different composition from that of the first semiconductor nanocrystal. At the interface between the core and the shell, an alloyed interlayer may be present or may not be present. The alloyed layer may include a homogeneous alloy. The alloyed layer may have a concentration gradient. In the gradient alloy, the concentration of an element of the shell radially changes (e.g., decreases or increases) toward the core. In addition, the shell may include a multi-layered shell having at least two layers wherein adjacent layers have different composition each other. In the multi-layered shell, each layer may have a single composition. In the multi-layered shell, each layer may have an alloy. In the multi-layered shell, each layer may have a concentration gradient that changes radially in light of a composition of a semiconductor nanocrystal.

In the core-shell semiconductor nanocrystal particle, the materials of the shell may have an energy bandgap that is larger than that of the core, but it is not limited thereto. The materials of the shell may have an energy bandgap that is smaller than that of the core. In the case of the multi-layered shell, the energy bandgap of the outermost layer material of the shell may be greater than those of the core and the inner layer material of the shell (a layer that is closer to the core). In the case of the multi-layered shell, a semiconductor nanocrystal of each layer is selected to have an appropriate energy, bandgap thereby effectively showing a quantum confinement effect.

The quantum dot may have a size (e.g., particle diameter or, in the case of a non-spherically shaped particle, an equivalent diameter calculated from a two dimensional area of an electron microscopic image of the particle) of about 1 nm to about 100 nm. In some embodiments, the quantum dot may have a particle size of about 1 nm to about 50 nm, for example, from 2 nm (or from 3 nm) to 35 nm. In some embodiments, the quantum dot have a size of greater than or equal to about 1 nm, greater than or equal to about 2 nm, greater than or equal to about 3 nm, greater than or equal to about 4 nm, or greater than or equal to about 5 nm. In some embodiments, the quantum dot have a size of less than or equal to about 50 nm, less than or equal to about 45 nm, less than or equal to about 40 nm, less than or equal to about 35 nm, less than or equal to about 30 nm, less than or equal to about 25 nm, less than or equal to about 20 nm, or less than or equal to about 15 nm.

The quantum dot may have a generally-used shape in the art, and is not particularly limited. For example, the quantum dot may include spherical, pyramidal, multi-armed, or cubic nanoparticles, nanotubes, nanowires, nanofibers, nanoplate particles, a combination thereof, or the like.

The quantum dot may be commercially available or may be synthesized in any method. For example, several nano-sized quantum dots may be synthesized by a wet chemical process. In the wet chemical process, precursors react in an organic solvent to grow semiconductor nanocrystal particles, and the organic solvent or a ligand compound may coordinate (or be bound) to the surface of the semiconductor nanocrystal particle, thereby controlling the growth of the semiconductor nanocrystal particle. Examples of the organic solvent and ligand compound are known.

The quantum dot as prepared may be recovered by pouring an excess amount of a non-solvent to a reaction solution including the quantum dot and centrifuging the resulting mixture. Examples of the non-solvent include acetone, ethanol, methanol, and the like, but are not limited thereto.

The quantum dot (for example, prepared by the wet chemical method) may have an organic ligand bonded to a surface thereof. In an embodiment, the organic ligand may include RCOOH, $RNH_2$, $R_2NH$, $R_3N$, RSH, $R_3PO$, $R_3P$, ROH, RCOOR', $RPO(OH)_2$, $R_2POOH$ (wherein R and R' are the same or different, and are independently a C5 to C24 aliphatic hydrocarbon group or a C5 to C20 aromatic hydrocarbon group), or a combination thereof.

Examples of the organic ligand compound may include:
a thiol compound such as methane thiol, ethane thiol, propane thiol, butane thiol, pentane thiol, hexane thiol, octane thiol, dodecane thiol, hexadecane thiol, octadecane thiol, benzyl thiol, or a combination thereof;

amine compounds such as methylamine, ethylamine, propylamine, butylamine, pentylamine, hexylamine, octylamine, nonylamine, decylamine, dodecylamine, hexadecylamine, octadecylamine, dimethylamine, diethylamine, dipropylamine, tributylamine, or trioctylamine, or a combination thereof;

carboxylic acid compounds such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, benzoic acid, or a combination thereof;

phosphine compounds such as methyl phosphine, ethyl phosphine, propyl phosphine, butyl phosphine, pentyl phosphine, octyl phosphine, dioctyl phosphine, tributyl phosphine, trioctyl phosphine, or a combination thereof;

phosphine oxide compounds such as methyl phosphine oxide, ethyl phosphine oxide, propyl phosphine oxide, butyl phosphine oxide, pentyl phosphine oxide, tributyl phosphine oxide, octylphosphine oxide, dioctyl phosphine oxide, trioctyl phosphine oxide, or a combination thereof;

diphenyl phosphine, triphenyl phosphine, oxide compounds thereof, or a combination thereof;

a C5 to C20 alkylphosphinic acid such as hexylphosphinic acid, octylphosphinic acid, dodecylphosphinic acid, tetradecylphosphinic acid, hexadecylphosphinic acid, or octadecyl phosphinic acid, or a combination thereof; or a combination thereof, but are not limited thereto.

The quantum dot may include the organic ligand alone or in a mixture form of at least two ligands.

The quantum dot be surface-exchanged (or encapped) with the aforementioned metal thiolate complex compound may show improved dispersability in medium in comparison with the one without being encapped. The non-solvent for the encapped quantum dots may be selected considering such changes in the dispersability. In some embodiments, the encapped quantum dots may be recovered for example via the addition of a proper organic non-solvent.

The composition may include an organic solvent.

Types of the organic solvent that may be used in the composition are not particularly limited. Types and amounts of the organic solvent may be selected considering the main components of the composition (e.g., the quantum dot, a COOH-containing binder, a polymerizable (e.g., photopolymerizable) monomer, a (photo) initiator, if present a thiol compound) and other additional additives that will be described below. The composition many include a solvent in a balance amount other than the solid content (e.g., an amount of the non-volatiles). The total solid content of the composition is not particularly limited. The total solid content of the composition may be greater than or equal to about 1 wt %, for example, greater than or equal to about 5 wt %, greater than or equal to about 10 wt %, greater than or equal to about 15 wt %, or greater than or equal to about 20 wt % and less than or equal to about 99 wt %, for example less than or equal to about 95 wt %, less than or equal to about 90 wt %, less than or equal to about 80 wt %, less than or equal to about 70 wt %, less than or equal to about 60 wt %, less than or equal to about 50 wt %, less than or equal to about 40 wt %, or less than or equal to about 30 wt %.

Types of the solvent may be selected appropriately in light of its affinity with other components of the composition (for example, a binder, a photopolymerizable monomer, a photoinitiator, other additives), its affinity with an alkaline developer, and/or its boiling point. Examples of the solvent may include: ethyl 3-ethoxy propionate; an ethylene glycol such as ethylene glycol, diethylene glycol, or polyethylene glycol; a ethylene glycol ether such as ethylene glycol monomethyl ether, ethylene glycol monoethyl ether, diethylene glycol monomethyl ether, ethylene glycol diethyl ether, and diethylene glycol dimethyl ether; an ethylene glycol ether acetates such as ethylene glycol monomethyl ether acetate, ethylene glycol monoethyl ether acetate, diethylene glycol monoethyl ether acetate, and diethylene glycol monobutyl ether acetate; a propylene glycol such as propylene glycol; propylene glycol ethers such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, and dipropylene glycol diethyl ether; propylene glycol ether acetates such as propylene glycol monomethyl ether acetate and dipropylene glycol monoethyl ether acetate; amides such as N-methylpyrrolidone, dimethyl formamide, and dimethyl acetamide; ketones such as methyl ethyl ketone (MEK), methyl isobutyl ketone (MIBK), and cyclohexanone; an aromatic hydrocarbon or derivatives thereof such as toluene, xylene; 1,2,4,5-tetramethylbenzene, 3-phenoxytoluene, dodecylbenzene, cyclohexylbenzene, tetralin, butyl phenyl ether, diphenyl ether; an aromatic hydrocarbon substituted for example with halogen, petroleum products such as solvent naphtha; esters such as ethyl acetate, butyl acetate, and ethyl lactate; ethers such as diethyl ether, dipropyl ether, and dibutyl ether; substituted or unsubstituted aliphatic hydrocarbon, for example, a C5 to C20 alkane or C5 to C40 alkene such as heptane, nonane, and the like; lactones such as γ-butyrolactone, gamma-valerolactone, ε-caprolactone, γ-caprolactone, δ-valerolactone, and/or a mixture thereof.

In the composition, the metal thiolate complex compound may passivate and/or endcap the quantum dot, and thus, improve the stability (e.g., the chemical and/or thermal stability) of the quantum dot and makes it possible to avoid a substantial optical efficiency decrease that may occur otherwise during the process of preparing the composition or the pattern of the quantum dot.

In the composition, an amount of the quantum dot and the metal thiolate complex compound may be controlled appropriately in light of a final use of the composition or the composite or an amount of other components.

In some embodiments, an amount of the quantum dot in the composition may be, based on a total weight of the composition, greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt %. In the composition, an amount of the quantum dot may be, based on a total weight of the composition, less than or equal to about 60 wt %, for example, less than or equal to about 59 wt %, less than or equal to about 58 wt %, less than or equal to about 57 wt %, less than or equal to about 56 wt %, less than or equal to about 55 wt %, less than or equal to about 54 wt %, less than or equal to about 53 wt %, less than or equal to about 52 wt %, less than or equal to about 51 wt %, less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, or less than or equal to about 30 wt %.

Accordingly, in some embodiments, an amount of the quantum dot in the composition (or an amount of the quantum dot in the composite) may be, based on a total weight of the solid content (non-volatiles) of the composition (or a total weight of the composite) greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt % and less than or equal to about 70 wt %, for example, less than or equal to about 69 wt %, less than or equal to about 68 wt %, less than or equal to about 67 wt %, less than or equal to about 66 wt %, less than or equal to about 65 wt %, less than or equal to about 64 wt %, less than or equal to about 63 wt %, less than or equal to about 62 wt %, less than or equal to about 61 wt %, less than or equal to about 60 wt %, less than or equal to about 59 wt %, less than or equal to about 58 wt %, less than or equal to about 57 wt %, less than or equal to about 56 wt %, less than or equal to about 55 wt %, less than or equal to about 54 wt %, less than or equal to about 53 wt %, less than or equal to about 52 wt %, less than or equal to about 51 wt %, less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, or less than or equal to about 30 wt %.

An amount of the metal thiolate complex compound may be, based on a total weight of the composition or the solid content of the composition (or a total weight of the composite), greater than or equal to about 1 wt %, for example, greater than or equal to about 2 wt %, greater than or equal to about 3 wt %, greater than or equal to about 4 wt %, greater than or equal to about 5 wt %, greater than or equal to about 7 wt %, or greater than or equal to about 9 wt % and less than or equal to about 55 wt %, for example, less than or equal to about 50 wt %, less than or equal to about 47 wt %, less than or equal to about 45 wt %, less than or equal to about 40 wt %, less than or equal to about 37 wt %, less than or equal to about 35 wt %, less than or equal to about 30 wt %, less than or equal to about 29 wt %, less than or equal to about 28 wt %, less than or equal to about 27 wt %, less than or equal to about 26 wt %, less than or equal to about 25 wt %, less than or equal to about 24 wt %, less than or equal to about 23 wt %, less than or equal to about 22 wt %, less than or equal to about 20 wt %, less than or equal to about 19 wt %, less than or equal to about 18 wt %, less than or equal to about 17 wt %, less than or equal to about 16 wt %, less than or equal to about 15 wt %, less than or equal to about 14 wt %, less than or equal to about 13 wt %, less than or equal to about 12 wt %, less than or equal to about 11 wt %, less than or equal to about 10 wt %, less than or equal to about 9 wt %, less than or equal to about 8 wt %, less than or equal to about 7 wt %, less than or equal to about 6 wt %, less than or equal to about 5 wt %, less than or equal to about 4 wt %, or less than or equal to about 3 wt %.

In some embodiments, the quantum dot composition further includes a binder polymer, a polymerizable monomer having a carbon-carbon double bond; and a photoinitiator. The composition may include a multi-thiol compound having at least one thiol group (e.g., at its end terminals).

The binder polymer may include a polymer including a repeating unit that has a carboxylic acid group. The binder polymer may include:

a copolymer of a monomer combination including a first monomer having a carboxylic acid group and a carbon-carbon double bond, a second monomer having a carbon-carbon double bond and a hydrophobic moiety and not having a carboxylic acid group, and optionally, a third monomer having a carbon-carbon double bond and a hydrophilic moiety and not having a carboxylic acid group;

a multi-aromatic ring-containing polymer including a carboxylic acid group (—COOH) and having a backbone structure in a main chain (e.g., a backbone structure incorporated in the main chain), wherein the backbone structure includes a quaternary carbon atom, which is a part of a cyclic group, and two aromatic rings bound to the quaternary carbon atom;

or a combination thereof.

The copolymer may include a first repeating unit derived from the first monomer, a second repeating unit derived from the second monomer, and optionally, a third repeating unit derived from the third monomer.

The first repeating unit may include a unit represented by Chemical Formula 3-1, a unit represented by Chemical Formula 3-2, or a combination thereof:

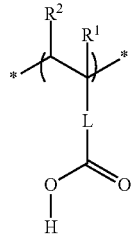

Chemical Formula 3-1 wherein
$R^1$ is hydrogen, a C1 to C3 alkyl group, or —$(CH_2)_n$—COOH (wherein n is 0 to 2),
$R^2$ is hydrogen, a C1 to C3 alkyl group, or —COOH,
L is a single bond, a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C3 to C30 alicyclic hydrocarbon group, and
* indicates a portion linked to an adjacent atom;

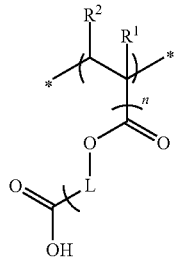

Chemical Formula 3-2 wherein $R^1$ is hydrogen, a C1 to C3 alkyl group, or —$(CH_2)_m$—COOH (wherein m is 0 to 2),
$R^2$ is hydrogen or a C1 to C3 alkyl group,
L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C3 to C30 alicyclic hydrocarbon group,
n is an integer of 1 to 3, and
* indicates a portion linked to an adjacent atom.

As used herein, examples of a C6 to C30 alicyclic hydrocarbon includes a cycloalkyl group such as a cyclohexyl group, a norbornyl group, a cycloalkenyl group such as a norbornenyl group and the like, a cycloalkylene group such as a cyclohexylene group, a norbornane group, and the like, a cycloalkenylene group such as a norbornene group, but are not limited thereto. As used herein, examples of a C6 to C30 aromatic hydrocarbon group includes a C6 to C30 aryl group such as a phenyl group, a naphthyl group, and the like, a C6 to C30 arylene group, but are not limited thereto. As used herein, examples of an aliphatic hydrocarbon group includes for example, a C1 to C15 alkyl group such as a methyl group, an ethyl group, and a propyl group, and a C1 to C15 alkylene group, but are not limited thereto.

The second repeating unit may include a unit represented by Chemical Formula 4-1, a unit represented by Chemical Formula 4-2, a unit represented by Chemical Formula 4-3, a unit represented by Chemical Formula 4-4, or a combination thereof:

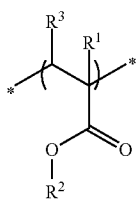

Chemical Formula 4-1 wherein $R^1$ is hydrogen or a C1 to C3 alkyl group, $R^2$ is a C1 to C15 aliphatic hydrocarbon group, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and

* indicates a portion linked to an adjacent atom;

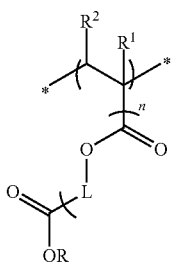

Chemical Formula 4-2 wherein $R^1$ is hydrogen or a C1 to C3 alkyl group,

L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C3 to C30 alicyclic hydrocarbon group, R is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^2$ is hydrogen or a C1 to C3 alkyl group, n is an integer of 1 to 3, and

* indicates a portion linked to an adjacent atom;

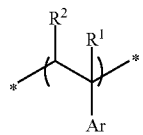

Chemical Formula 4-3 wherein each of $R^1$ and $R^2$ is independently hydrogen or a C1 to C3 alkyl group, Ar is a substituted or unsubstituted C6 to C30 aromatic hydrocarbon group or a substituted or unsubstituted C6 to C30 alicyclic hydrocarbon group, and

* indicates a portion linked to an adjacent atom;

Chemical Formula 4-4 wherein $R^1$ is hydrogen or a C1 to C3 alkyl group, $R^2$ is a C1 to C15 aliphatic hydrocarbon group, a C6 to C30 aromatic hydrocarbon group, a C3 to C30 alicyclic hydrocarbon group, or a C1 to C15 aliphatic hydrocarbon group substituted with a C6 to C30 aromatic hydrocarbon group or a C3 to C30 alicyclic hydrocarbon group, $R^3$ is hydrogen or a C1 to C3 alkyl group, and

* indicates a portion linked to an adjacent atom.

The third repeating unit derived from the third monomer may be represented by Chemical Formula 5:

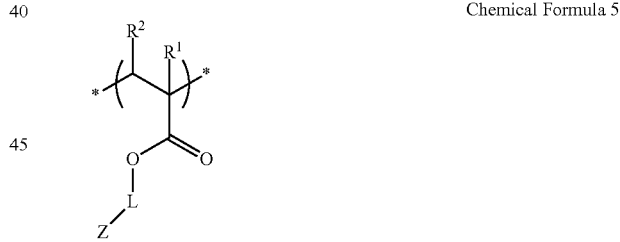

Chemical Formula 5 wherein each of $R^1$ and $R^2$ is independently hydrogen or a C1 to C3 alkyl group, L is a C1 to C15 alkylene group, a C1 to C15 alkylene group wherein at least one methylene group is substituted with —C(=O)—, —O—, or —C(=O)O—, a C6 to C30 aromatic hydrocarbon group, a C6 to C30 alicyclic hydrocarbon group, or a C1 to C15 aliphatic hydrocarbon group substituted with a C6 to C30 aromatic hydrocarbon group or a C3 to C30 alicyclic hydrocarbon group, Z is a hydroxyl group (—OH), a mercapto group (—SH), or an amino group (—NHR, wherein R is hydrogen or a C1 to C5 alkyl group) and

* indicates a portion linked to an adjacent atom.

Examples of the first monomer may include, but are not limited to, acrylic acid, methacrylic acid, maleic acid, itaconic acid, fumaric acid, 3-butenoic acid, carboxylic acid vinyl ester compounds such as vinyl acetate, and vinyl benzoate. The first monomer may include one or more compounds.

Examples of the second monomer may include, but are not limited to:

alkenyl aromatic compounds such as styrene, α-methyl styrene, vinyl toluene, or vinyl benzyl methyl ether;

unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;

unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;

maleimides such as N-phenylmaleimide, N-benzylmaleimide, N-alkylmaleimide;

unsaturated carboxylic acid glycidyl ester compounds such as glycidyl acrylate or glycidyl methacrylate;

vinyl cyanide compounds such as acrylonitrile or methacrylonitrile; and unsaturated amide compounds such as acrylamide or methacrylamide, but are not limited thereto.

As the second monomer, at least one compound may be used.

If present, examples of the third monomer may include 2-hydroxy ethyl acrylate, 2-hydroxy ethyl methacrylate, hydroxy propyl acrylate, hydroxy propyl methacrylate, hydroxy butyl acrylate, and hydroxy butyl methacrylate, but are not limited thereto. The third monomer may include one or more compounds.

In the binder polymer, an amount of the first repeating unit derived from the first monomer may be greater than or equal to about 10 mole percent (mol %), for example, greater than or equal to about 15 mol %, greater than or equal to about 25 mol %, or greater than or equal to about 35 mol %. In the binder polymer, an amount of the first repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, an amount of the second repeating unit derived from the second monomer may be greater than or equal to about 10 mol %, for example, greater than or equal to about 15 mol %, greater than or equal to about 25 mol %, or greater than or equal to about 35 mol %. In the binder polymer, an amount of the second repeating unit may be less than or equal to about 90 mol %, for example, less than or equal to about 89 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, if present, an amount of the third repeating unit derived from the third monomer may be greater than or equal to about 1 mol %, for example, greater than or equal to about 5 mol %, greater than or equal to about 10 mol %, or greater than or equal to about 15 mol %. In the binder polymer, an amount of the third repeating unit may be less than or equal to about 20 mol %, for example, less than or equal to about 15 mol %, or less than or equal to about 10 mol %.

In an embodiment, the binder polymer may be a copolymer of (meth)acrylic acid (i.e., the first monomer) and at least one second or third monomer including arylalkyl(meth)acrylate, hydroxyalkyl (meth)acrylate, or styrene. For example, the binder polymer may include a methacrylic acid/methyl methacrylate copolymer, a methacrylic acid/benzyl methacrylate copolymer, a methacrylic acid/benzyl methacrylate/styrene copolymer, a methacrylic acid/benzyl methacrylate/2-hydroxy ethyl methacrylate copolymer, or a methacrylic acid/benzyl methacrylate/styrene/2-hydroxy ethyl methacrylate copolymer.

In an embodiment, the binder polymer may include a multi-aromatic ring-containing polymer including a carboxylic acid group (—COOH) and a main chain including a backbone structure incorporated therein, wherein the backbone structure includes a quaternary carbon atom, which is a part of a cyclic group, and two aromatic rings bound to the quaternary carbon atom. The carboxylic acid group may be bonded to the main chain.

In the multi-aromatic ring-containing polymer, the backbone structure may include a unit represented by Chemical Formula A:

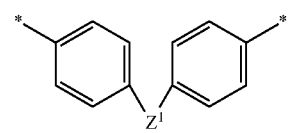

Chemical Formula A wherein

* indicates a portion that is linked to an adjacent atom of the main chain of the binder, $Z^1$ is a linking moiety represented by any one of Chemical Formulae A-1 to A-6, and in Chemical Formulae A-1 to A-6, * indicates a portion that is linked to an adjacent atom in the aromatic ring:

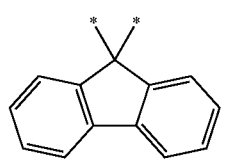

Chemical Formula A-1

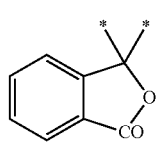

Chemical Formula A-2

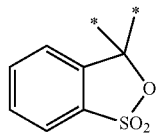

Chemical Formula A-3

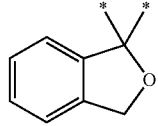

Chemical Formula A-4

Chemical Formula A-5

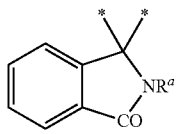

wherein $R_a$ is hydrogen, an ethyl group, —$C_2H_4Cl$, —$C_2H_4OH$, —$CH_2CH$=$CH_2$, or a phenyl group, Chemical Formula A-6

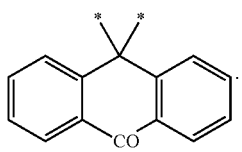

The multi-aromatic ring-containing polymer may include a structural unit represented by Chemical Formula B:

Chemical Formula B

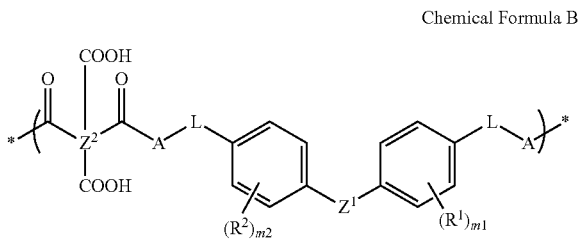

wherein $Z^1$ is a linking moiety represented by any one of Chemical Formulae A-1 to A-6, L is a single bond, a C1 to C10 alkylene, a C1 to C10 alkylene having a substituent including a carbon-carbon double bond, a C1 to C10 oxy alkylene, or a C1 to C10 oxy alkylene having a substituent including a carbon-carbon double bond, A is —NH—, —O—, or a C1 to C10 alkylene, $Z^2$ is a C6 to C40 aromatic organic group, each of $R^1$ and $R^2$ is independently hydrogen, a halogen, or a substituted or unsubstituted C1 to C20 alkyl group, m1 and m2 are the same or different, and are independently an integer ranging from 0 to 4, and

* indicate a portion that is linked to an adjacent atom.

In Chemical Formula B, $Z^2$ may be any one of Chemical Formula B-1, Chemical Formula B-2, and Chemical Formula B-3:

Chemical Formula B-1

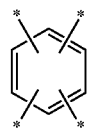

wherein * indicates a portion that is linked to an adjacent carbonyl carbon,

Chemical Formula B-2

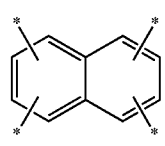

wherein * indicates a portion that is linked to an adjacent carbonyl carbon,

Chemical Formula B-3

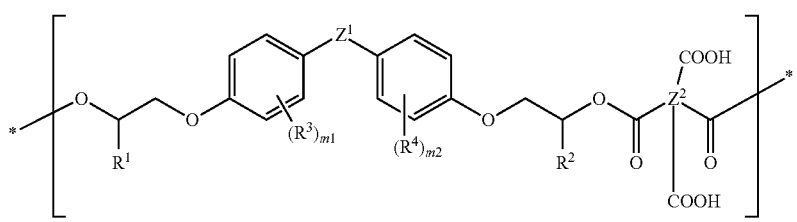

wherein * indicates a portion that is linked to an adjacent carbonyl carbon,

L is a single bond, —O—, —S—, —C(=O)—, —CH(OH)—, —S(=O)$_2$—, —Si(CH$_3$)$_2$—, —(CH$_2$)$_p$— (wherein 1≤p≤10), —(CF$_2$)$_q$— (wherein 1≤q≤10), —CR$_2$— (wherein R is independently hydrogen, a C1 to C10 aliphatic hydrocarbon group, a C6 to C20 aromatic hydrocarbon group, or a C3 to C20 alicyclic hydrocarbon group), —C(CF$_3$)$_2$—, —C(CF$_3$)(C$_6$H$_5$)—, or —C(=O)NH—.

The multi-aromatic ring-containing polymer may include a structural unit represented by Chemical Formula C:

Chemical Formula C

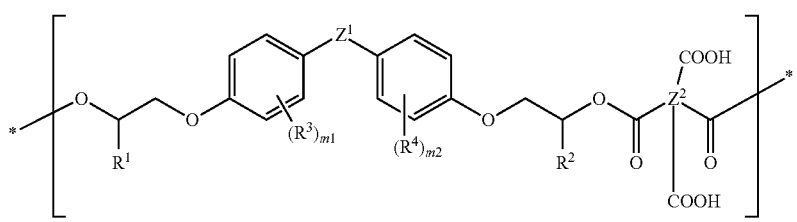

wherein each of $R^1$ and $R^2$ is independently hydrogen or a substituted or unsubstituted (meth)acryloyloxyalkyl group, each of $R^3$ and $R^4$ is independently hydrogen, a halogen, or a substituted or unsubstituted C1 to C20 alkyl group, $Z^1$ is a linking moiety represented by any of Chemical Formulae A-1 to A-6, $Z^2$ is an aromatic organic group such as the moieties represented by any of Chemical Formulae B-1 to B-3 as set forth above, m1 and m2 are the same or different, and are independently an integer ranging from 0 to 4, and \* indicates a portion that is linked to an adjacent atom.

In some embodiments, the multi-aromatic ring-containing polymer may be an acid adduct of a bisphenol fluorene epoxy acrylate monomer. For example, the bisphenol fluorene epoxy acrylate may be prepared by reacting 4,4-(9-fluorenylidene)-diphenol and epichlorohydrin to obtain an epoxy compound having a fluorene moiety, and the epoxy compound is reacted with an acrylic acid to obtain a fluorenyl epoxy acrylate, which is then further reacted with biphenyl dianhydride and/or phthalic anhydride or tetrahydrophthalic anhydride. The aforementioned reaction scheme may be summarized as below:

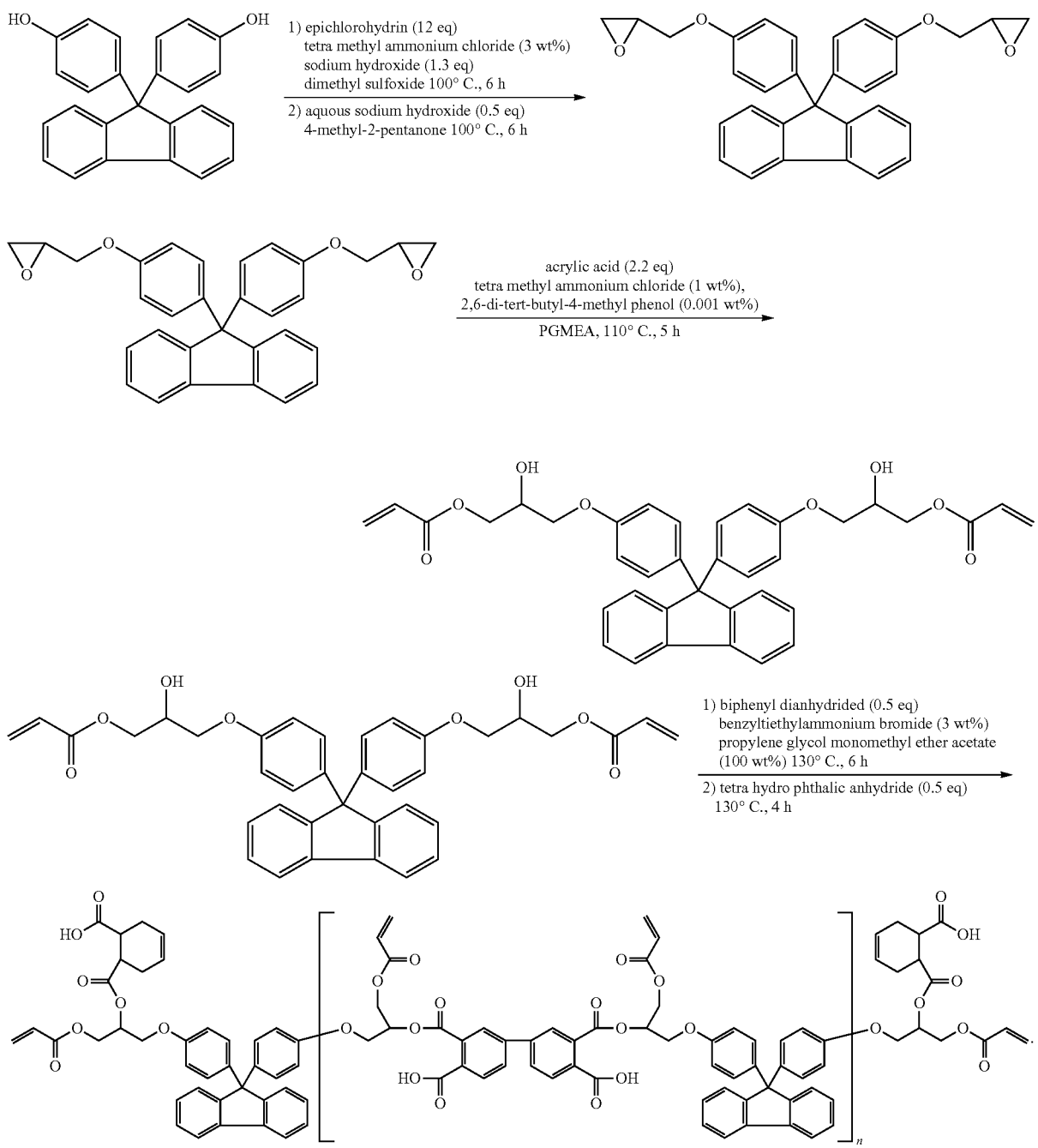

The multi-aromatic ring-containing polymer may include a functional group represented by Chemical Formula D at one or both terminal ends:

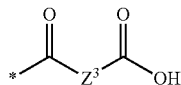

Chemical Formula D wherein
* indicates a portion that is linked to an adjacent atom, and
$Z^3$ is a moiety represented by one of Chemical Formulae D-1 to D-7:

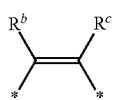

Chemical Formula D-1 wherein each of $R^b$ and $R^c$ is independently hydrogen, a substituted or unsubstituted C1 to C20 alkyl group, a substituted or unsubstituted C1 to C20 alkyl group, wherein at least one methylene is replaced with an ester group, an ether group, or a combination thereof, and
* indicates a portion that is linked to an adjacent atom.

Chemical Formula D-2

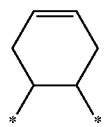

Chemical Formula D-3

Chemical Formula D-4

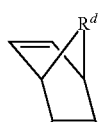

Chemical Formula D-5 wherein $R^d$ is O, S, NH, a substituted or unsubstituted C1 to C20 alkylene group, a C1 to C20 alkylamine group, or a C2 to C20 alkenylamine group.

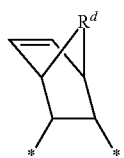

Chemical Formula D-6

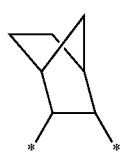

Chemical Formula D-7

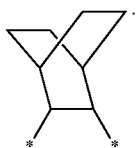

The multi-aromatic ring-containing polymer may be synthesized by a known method or is commercially available (e.g., from Nippon Steel Chemical Co., Ltd.).

As non-limiting examples, the multi-aromatic ring-containing polymer may include a structural unit derived from a reaction product of a fluorene compound such as 9,9-bis(4-hydroxyphenyl)fluorene, 9,9-bis(4-aminophenyl)fluorene, 9,9-bis[4-(glycidyloxy)phenyl]fluorene, 9,9-bis[4-(2-hydroxyethoxy)phenyl]fluorene, 9,9-bis-(3,4-dicarboxyphenyl)fluorene dianhydride, or a combination thereof, with an appropriate compound capable of reacting with the fluorene compound. The appropriate compound capable of reacting with the fluorene compound may include, but are not limited to, an aromatic dianhydride such as pyromellitic dianhydride (PMDA), biphenyltetracarboxylic dianhydride (BPDA), benzophenone tetracarboxylic dianhydride, and naphthalene tetracarboxylic dianhydride; a C2 to C30 diol compound; epichlorohydrin; or a combination thereof.

The fluorene compound, the dianhydrides, the diol compound, and the like are commercially available, and the reaction conditions therebetween are known in the art.

The binder polymer may have an acid value of greater than or equal to about 50 milligrams of KOH per gram of the polymer (mg KOH/g). For example, the binder polymer may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The binder polymer may have an acid value of, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, less than or equal to about 170 mg KOH/g, or less than or equal to about 160 mg KOH/g, but it is not limited thereto.

While not wishing to be bound by theory, it is understood that when the quantum dots are mixed with a solution of a binder having the acid value within the aforementioned range to provide a quantum dot-binder dispersion, the obtained quantum dot-binder dispersion may have the improved compatibility with the other components for the compositions of the embodiments (e.g., photopolymerizable monomer, photoinitiator, solvent, etc.), and thereby the quantum dots may be relatively uniformly dispersed in the final composition (e.g., photoresist composition).

The binder polymer (e.g., containing the carboxylic acid group) may have a molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a molecular weight of less than or equal to about 100,000 g/mol, for example, less than or equal to about 90,000 g/mol, less than or equal to about 80,000 g/mol, less than or equal to about 70,000 g/mol, less than or equal to about 60,000 g/mol, less than or equal to about 50,000 g/mol, less than or equal to about 40,000 g/mol, less than or equal to about 30,000 g/mol, or less than or equal to about 20,000 g/mol, or less than or equal to about 10,000 g/mol.

In the composition, an amount of the binder may be controlled considering a final use and other components of the composition. In the embodiments, an amount of the binder may be, based on a total weight of a solid content of the composition (or a total weight of the composite), greater than or equal to about 1 wt %, for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt % and less than or equal to about 70 wt %, for example, less than or equal to about 65 wt %, less than or equal to about 60 wt %, less than or equal to about 59 wt %, less than or equal to about 58 wt %, less than or equal to about 57 wt %, less than or equal to about 56 wt %, less than or equal to about 55 wt %, less than or equal to about 54 wt %, less than or equal to about 53 wt %, less than or equal to about 52 wt %, less than or equal to about 51 wt %, less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, or less than or equal to about 30 wt %.

In the composition, the (photo)polymerizable monomer having a carbon-carbon double bond may include a (meth)acrylate monomer. The photopolymerizable (meth)acrylate monomer may include, but are not limited to, alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy(meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

In some embodiments, an amount of the (photo)polymerizable monomer may be, based on a total weight of a solid content of the composition (or a total weight of the composite), greater than or equal to about 0.5 wt %, for example, greater than or equal to about 1 wt %, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 11 wt %, greater than or equal to about 12 wt %, greater than or equal to about 13 wt %, greater than or equal to about 14 wt %, greater than or equal to about 15 wt %, greater than or equal to about 16 wt %, greater than or equal to about 17 wt %, greater than or equal to about 18 wt %, greater than or equal to about 19 wt %, or greater than or equal to about 20 wt % and less than or equal to about 70 wt %, for example, less than or equal to about 65 wt %, less than or equal to about 59 wt %, less than or equal to about 58 wt %, less than or equal to about 57 wt %, less than or equal to about 56 wt %, less than or equal to about 55 wt %, less than or equal to about 53 wt %, less than or equal to about 52 wt %, less than or equal to about 51 wt %, less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, or less than or equal to about 30 wt %.

In the composition, the initiator (e.g., the photoinitiator) included in the composition is a compound capable of initiating a radical polymerization of the photopolymerizable monomer (e.g., acyclic monomer such as an (meth)acrylate monomer or a vinyl monomer) and/or the thiol compound (that will be explained below) (for example, by light). Types of the photoinitiator are not particularly limited. For example, the available (photo)polymerization initiator may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, or a combination thereof, but it is not limited thereto.

In a non-limiting example, the examples of the triazine compound may include 2,4,6-trichloro-s-triazine, 2-phenyl-4,6-bis(trichloromethyl)-s-triazine, 2-(3',4'-dimethoxystyryl)-4,6-bis(trichloromethyl)-s-triazine, 2-(4'-methoxynaphthyl)-4,6-bis(trichloromethyl)-s-triazine, 2-(p-methoxy phenyl)-4,6-bis(trichloromethyl)-s-triazine, 2-(p-tolyl)-4,6-bis(trichloromethyl)-s-triazine, 2-biphenyl-4,6-bis(trichloromethyl)-s-triazine, 2,4-bis(trichloromethyl)-6-styryl-s-triazine, 2-(naphth-1-yl)-4,6-bis(trichloromethyl)-s-triazine, 2-(4-methoxynaphth-1-yl)-4,6-bis(trichloromethyl)-s-triazine, 2,4-bis(trichloromethyl)-6-(piperonyl)-s-triazine, and 2,4-bis(trichloromethyl)-6-(4'-methoxystyryl)-s-triazine, but are not limited thereto.

Examples of the acetophenone compound may be 2,2'-diethoxyacetophenone, 2,2'-dibutoxyacetophenone, 2-hydroxy-2-methylpropiophenone, p-t-butyltrichloroacetophenone, p-t-butyldichloroacetophenone, 4-chloroacetophenone, 2,2'-dichloro-4-phenoxyacetophenone, 2-methyl-1-(4-(methylthio)phenyl)-2-morpholinopropan-1-one, 2-benzyl-2-di methylamino-1-(4-morpholinophenyl)-butan-1-one, and the like, but are not limited thereto.

Examples of the benzophenone compound may be benzophenone, benzoyl benzoate, methyl benzoyl benzoate, 4-phenylbenzophenone, hydroxybenzophenone, acrylated benzophenone, 4,4'-bis(dimethylamino)benzophenone, 4,4'-dichlorobenzophenone, 3,3'-dimethyl-2-methoxybenzophenone, and the like, but are not limited thereto.

Examples of the thioxanthone compound may be thioxanthone, 2-methylthioxanthone, 2-isopropylthioxanthone, 2,4-diethylthioxanthone, 2,4-diisopropylthioxanthone, 2-chlorothioxanthone, and the like, but are not limited thereto.

Examples of the benzoin compound may include benzoin, benzoin methyl ether, benzoin ethyl ether, benzoin isopropyl ether, benzoin isobutyl ether, benzyl dimethyl ketal, and the like, but are not limited thereto.

Examples of the oxime compound may be 2-(O-benzoyloxime)-1-[4-(phenylthio)phenyl]-1,2-octandione, 1-(O-acetyloxime)-1-[9-ethyl-6-(2-methylbenzoyl)-9H-carbazol-3-yl]ethanone, and the like, but are not limited thereto.

In the composition, an amount of the photoinitiator may be greater than or equal to about 0.01 wt %, for example, greater than or equal to about 0.1 wt %, or greater than or equal to about 1 wt %, based on the total weight of the composition. The amount of the photoinitiator may be less than or equal to about 10 wt %, for example, less than or equal to about 5 wt %, based on the total weight of the composition. However, the amount of the photoinitiator is not limited thereto.

In some embodiments, the composition may further include a multi-thiol compound having at least two thiol groups (e.g., at its terminal ends). The multi-thiol compound may include a compound represented by Chemical Formula 6 defined as above. The multi-thiol compound may include a compound of Chemical Formula 6-1 defined as above.

The multi-thiol compound may participate in the reaction with the photopolymerizable monomer without having an adverse effect on the dispersibility of the quantum dots to form a polymerization product (i.e., the thiol-ene polymer).

The multi-thiol compound may include a dithiol compound (other than a cis-type dithiol), a trithiol compound, a tetrathiol compound, or a combination thereof. For example, the thiol compound may include glycol di-3-mercaptopropionate (e.g., C2 to C10 alkylene glycol di-3-mercaptopropionate, such as ethylene glycol di-3-mercaptopropionate), glycol dimercaptoacetate (e.g., C2 to C10 alkylene glycol dimercaptoacetate, such as ethylene glycol dimercaptoacetate), trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol including 1 to 10 ethylene glycol repeating units, or a combination thereof.

An amount of the multi-thiol compound may be, based on a total weight of a solid content of the composition (or a total weight of the composite), 65 wt %, less than or equal to about less than or equal to about 60 wt %, less than or equal to about 50 wt %, less than or equal to about 40 wt %, less than or equal to about 30 wt %, less than or equal to about 25 wt %, less than or equal to about 20 wt %, less than or equal to about 19 wt %, less than or equal to about 18 wt %, less than or equal to about 17 wt %, less than or equal to about 15 wt %, less than or equal to about 14 wt %, less than or equal to about 13 wt %, less than or equal to about 12 wt %, less than or equal to about 11 wt %, less than or equal to about 10 wt %, less than or equal to about 9 wt %, less than or equal to about 8 wt %, less than or equal to about 7 wt %, less than or equal to about 6 wt %, less than or equal to about 5 wt %. An amount of the multi-thiol compound may be, based on a total weight of the composition or a total weight of a solid content of the composition (or a total weight of the composite), greater than or equal to about 0.1 wt %, for example, greater than or equal to about 0.5 wt %, greater than or equal to about 1 wt %, greater than or equal to about 2 wt %, greater than or equal to about 3 wt %, greater than or equal to about 4 wt %, or greater than or equal to about 4.5 wt %.

If desired, the composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot polymer composite, and optionally, the patterning of the composite.

The light diffusing agent may increase a refractive index of the composition in order to increase a chance of the incident light to meet with quantum dots. The light diffusing agent may include inorganic oxide particles such as alumina, silica, zirconia, titanium oxide or zinc oxide particulates, and metal particles such as gold, silver, copper, or platinum, but is not limited thereto.

The leveling agent may prevent stains or spots and to improve planarization and leveling characteristics of a film, and examples thereof may include the following but are not limited thereto. For example, a fluorine-containing leveling agent may include commercial products, for example BM-1000® and BM-1100® of BM Chemie Inc.; MEGAFACE F 142D®, F 172®, F 173®, and F 183® of Dainippon Ink Kagaku Kogyo Co., Ltd.; FC-135®, FC-170C®, FC-430®, and FC-431® of Sumitomo 3M Co., Ltd.; SURFLON S-112®, SURFLON S-113®, SURFLON S-131®, SURFLON S-141®, and SURFLON S-145® of Asahi Glass Co., Ltd.; and SH-28PA®, SH-190®, SH-193®, SZ-6032®, SF-8428®, and the like of Toray Silicone Co., Ltd.

The coupling agent may increase adhesion with respect to the substrate, and examples thereof may include a silane coupling agent. Examples of the silane coupling agent may be vinyl trimethoxysilane, vinyl tris(2-methoxyethoxysilane), 3-glycidoxypropyltrimethoxysilane, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, 3-mercaptopropyltrimethoxysilane, and the like. Types and the amounts of the additives may be adjusted, if desired.

If present, the amount of the additives may be, based on a total weight of the composition (or a solid content of the composition) greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

The composition of the embodiments may be prepared by a method that includes:

preparing a quantum dot binder dispersion including the quantum dots, the polyvalent metal thiolate complex compound (e.g., bound to a surface of the quantum dot), an organic solvent, and optionally the binder polymer (e.g., that may contain the carboxylic acid group (COOH)); and mixing the quantum dot binder dispersion with a photoinitiator, the photopolymerizable monomer (e.g., (meth) acrylate monomer), optionally the thiol compound, and optionally, at least one of the foregoing additives.

The quantum dots and the metal thiolate complex compound may be included in the dispersion in the form of an encapped quantum dot as a complex (e.g., as surface-exchanged) (i.e., quantum dot-metal thiolate compound complex, also referred to as quantum dot complex). The quantum dot binder dispersion may be prepared by mixing the quantum dot (e.g., encapped with the metal thiolate complex compound) with the binder polymer solution. The polyvalent metal thiolate complex compound may be mixed as it is dissolved in a solvent that is miscible with other components in the composition.

The foregoing components may be mixed in any order or simultaneously, and the order of the mixing is not particularly limited.

The composition may have a shear viscosity of less than or equal to about 10 centipoise (cPs), for example, less than 10 cPs or less than or equal to about 9 cPs, less than or equal to about 8 cPs at a temperature of about 23° C. to 25° C. The composition may have a shear viscosity of greater than or equal to about 2 cPs, for example, greater than or equal to about 3 cPs at a temperature of about 23° C. to 25° C. In some embodiments, the shear viscosity of the composition may be in a range of 4 to 6 cPs at a temperature of about 23° C. to 25° C. As used herein, the shear viscosity is a viscosity that can be measured by using a rotating concentric cylinder viscometer, a rotating cone and plate type viscometer, or a rotating parallel disc type viscometer.

In the composition, the quantum dot may have improved stability without occurrence of gelation after a predetermined period of time, and thus, the composition may provide enhanced processability. In some embodiments, the composition does not show a substantial change in viscosity when it is left at a temperature of greater than or equal to about 4° C. (e.g., at room temperature) for at least 120 hours (hrs). For example, when the composition is left at a temperature of 4° C. for 144 hrs, a viscosity increase of the composition may be less than or equal to about 10%, for example, less than about 10%, less than or equal to about 9%, less than or equal to about 8%, less than or equal to about 7%, less than or equal to about 6%, less than or equal to about 5%, less than or equal to about 4%, less than or equal to about 3%, less than or equal to about 2%, or even less than or equal to about 1% with respect to its initial viscosity.

The composition may provide a quantum dot polymer composite via a polymerization (e.g., initiated by light). When the polymerization occurs in a selected area, a pattern of the quantum dot polymer composite may be obtained. If desired, the composite thus obtained may undergo a post heating or a post baking process for example, at a temperature of 150° C. to 230° C. (e.g., 180° C.) for a predetermined period of time (e.g., 10 minutes (min) or longer or 20 min or longer).

Thus, in some embodiments, a quantum dot polymer composite may include a polymer matrix; and (a plurality of) the aforementioned quantum dots and the aforementioned metal thiolate complex compound. The metal thiolate complex compound may be attached to a surface of the quantum dot. Details of the quantum dot having the metal thiolate complex compound on a surface thereof are the same as set forth above.

In some embodiments, the quantum dot polymer composite may be prepared from the aforementioned composition. In other embodiments, the polymer matrix may include a thiol-ene polymer, a (meth)acrylate polymer, a urethane polymer, an epoxy polymer, a vinyl polymer, a silicone polymer, or a combination thereof. The polymer matrix may include the aforementioned additives.

The polymer matrix may include a cross-linked polymer; and a binder polymer having a carboxylic acid-containing repeating unit. The cross-lined polymer may include a thiol-ene polymer, a crosslinked poly(meth)acrylate, or a combination thereof. In some embodiments, the crosslinked polymer may include a polymerization product of the aforementioned photopolymerizable monomer and optionally the multi-thiol compound. Details of the binder polymer are the same as set forth above.

The quantum dot polymer composite may show enhanced stability (e.g., chemical and/or thermal stability), and thus, may maintain an increased level of light conversion rate even when it is heated at 180° C. for about 30 minutes.

In the quantum dot polymer composite, an amount of the quantum dots is not particularly limited, and thus, may be selected appropriately. For example, in the quantum dot polymer composite, an amount of the quantum dot may be, based on a total weight of the composite, greater than or equal to about 1 wt %, for example, greater than or equal to about 2 wt %, greater than or equal to about 3 wt %, greater than or equal to about 4 wt %, or greater than or equal to about 5 wt %, but is not limited thereto. In the quantum dot polymer composite, an amount of the quantum dot may be, based on a total weight of the composite, less than or equal to about 70 wt %, for example, less than or equal to about 60 wt %, less than or equal to about 55 wt %, less than or equal to about 50 wt %, less than or equal to about 45 wt %, or less than or equal to about 40 wt %, but is not limited thereto.

An amount of the polymer matrix may be, based on total weight of the composite, greater than or equal to about 1 wt %, greater than or equal to about 2 wt %, greater than or equal to about 10 wt %, greater than or equal to about 20 wt %, or greater than or equal to about 30 wt %. An amount of the polymer matrix may be, based on total weight of the composite, less than or equal to about 99 wt %, less than or equal to about 80 wt %, or less than or equal to about 70 wt %.

In other embodiments, a layered structure includes a substrate and a luminescent layer (e.g., a photoluminescent layer) disposed on the substrate. The luminescent layer may include at least one repeating section emitting light of a predetermined peak wavelength. The repeating section may include the aforementioned quantum dot polymer composite. In some embodiments, the luminescent layer may include a pattern of the aforementioned quantum dot polymer composite. The repeating section may include a first section emitting a first light, a second section emitting a second light, a third section emitting or passing a third light, wherein the second light has a peak wavelength different from that of the first light and the third light has a peak wavelength different from those of the first light and the second light.

The first light and the second light have different maximum peak emission wavelength (or peak wavelength) in a photoluminescent spectrum. In some embodiments, the first light may be a red light having the maximum peak emission wavelength at a range from 620 nm to 650 nm (e.g., from about 630 nm to about 640 nm), and the second light may be a green light having the maximum peak emission wavelength at a range from 500 nm to 550 nm (from about 510 nm to about 540 nm).

The substrate may be a substrate including an insulating material. The substrate may include glass; various polymers (e.g., polyester such as polyethylene terephthalate (PET) or polyethylene naphthalate (PEN)), polycarbonate, polyimide, polyamide-imide, poly(meth)acrylate, a thiol-ene polymer, and poly(meth)acrylic acid; polysiloxane (e.g. PDMS); an inorganic material such as $Al_2O_3$ or ZnO; or a combination thereof, but is not limited thereto. As used herein, the term "transparent" refers to the case where light transmittance is greater than or equal to about 80%, for example, greater than or equal to about 85% or greater than or equal to about 90% with respect to light of a predetermined wavelength (e.g., light emitted from the quantum dot). A thickness of the transparent substrate may be appropriately selected considering a substrate material but is not particularly limited. The transparent substrate may have flexibility.

In embodiments, a method of producing the aforementioned layered structure includes forming a film of the aforementioned composition on a substrate;

exposing a selected area of the film to light (e.g., having a wavelength of less than or equal to about 400 nm); and developing the exposed film with an alkaline developer (such as an alkali aqueous solution) to obtain a pattern of a quantum dot polymer composite, the pattern may form a luminescent layer such as a photoluminescent layer.

Details of the substrate and the composition are the same as set forth above. A non-limiting method of forming a pattern is explained referring to FIG. 1.

The composition is coated on a transparent substrate in an appropriate manner such as spin coating or slit coating to form a film of a predetermined thickness (e.g., a thickness of less than or equal to about 30 μm for example less than or equal to about 10 μm, less than or equal to about 8 μm, less than or equal to about 7 μm and of greater than about 3 μm, for example, greater than or equal to about 3.5 μm, or greater than or equal to about 4 μm). The formed film may be pre-baked, if desired. The temperature, the time, and the atmosphere for the prebaking are known and may be selected appropriately.

The formed (and optionally pre-baked) film is exposed to light having a predetermined wavelength under a mask having a predetermined pattern. A wavelength and intensity of the light may be selected considering the types and the amounts of the photoinitiator, the types and the amounts of the quantum dots, and the like.

When the exposed film is treated (e.g., immersed or sprayed) with an alkaline developer (e.g., alkaline aqueous solution), the non-exposed areas of the film are dissolved to form a desired pattern. The obtained pattern may be post-baked, if desired, for example, at a temperature of about 150° C. to about 230° C. for a predetermined time (e.g., greater than or equal to about 10 min or greater than or equal to about 20 min), to improve crack resistance and solvent resistance of the pattern.

Unlike conventional ones, the quantum dot (photosensitive, e.g., photoresist) composition of the embodiments may show only a minimized chemical damage during a production thereof and a composite or a pattern thereof prepared using the same may maintain its luminous properties at an improved level even after a heat-treatment thereof at a relatively high temperature.

In addition, a viscosity of the composition of the embodiment may be kept at a desired level for a relatively prolonged period of time and during a developing process after the exposure to light, a re-dissolubility of the quantum dot polymer composite prepared therefrom is excellent. As used herein, the term "re-dissolubilty" refers to a property of the composition determined by whether a composite prepared therefrom may be re-dissolved without any substantial peeling or tearing during a developing process after the exposure to light. In order to realize a mass-production of a pattern, securing such re-dissolubility may be critical.

Without wishing to be bound by any theory, the quantum dot composition of the embodiments includes the aforementioned metal thiolate complex compound (for example, linked to a surface of the quantum dot), and thus, the hydrophobic moiety of the compound may participate in an enhanced level of interaction, for example, with the hydrophobic moiety of the binder polymer, which in turn makes it possible for the carboxylic acid group of the binder to participate more actively in the developing process. Accordingly, the quantum dot polymer composite prepared from the composition of the embodiments may be dissolved in a developer (e.g., aqueous alkaline developer) during a developing process.

In addition, the present inventors have found that directly mixing a metal salt (e.g., a zinc salt) and a thiol, a (photo) polymerizable monomer, and a binder polymer with the quantum dot causes aggregation and gelation of the composition. Without wishing to be bound by any theory, interaction among the metal salt, the thiol, the (photo) polymerizable monomer, and the binder polymer may have side effects on a viscosity of the composition, whereby the viscosity may dramatically increase over time. However, in the quantum dot composition of the embodiments, the metal thiolate complex compound (for example, encapping the quantum dot) may achieve an improved level of chemical stability and thereby an increase of the viscosity or an unwanted aggregation of the quantum dots may be minimized.

When a quantum dot-polymer composite is to have a plurality of repeating sections, a plurality of compositions each including the quantum dots with a desired light emitting property (e.g., a desired photoluminescent peak wavelength) is prepared for the formation of each of the repeating sections and the patterning process is repeated as many times as necessary (e.g., two times or three times) for each composition to provide a quantum dot-polymer composite having a desirable pattern. For example, the quantum dot polymer composite may be processed to have a repeating pattern having at least two different color sections (e.g., RGB color sections). The pattern of the quantum dot polymer composite may replace an absorption type color filter, and thus, may be used as a photoluminescent color filter in a display device. The display device may be a liquid crystal display device. The display device may be a display including at least one organic light emitting diode (OLED) as a light source.

In some embodiments, a liquid crystal display includes a backlight unit including a light source to provide a third light, a lower substrate disposed on the backlight unit; the aforementioned layered structure; and a liquid crystal layer interposed between the lower substrate and the layered structure, wherein the layered structure is disposed for the photoluminescent layer to face the liquid crystal layer. A polarizer plate may be disposed below the lower substrate.

Figure 2:
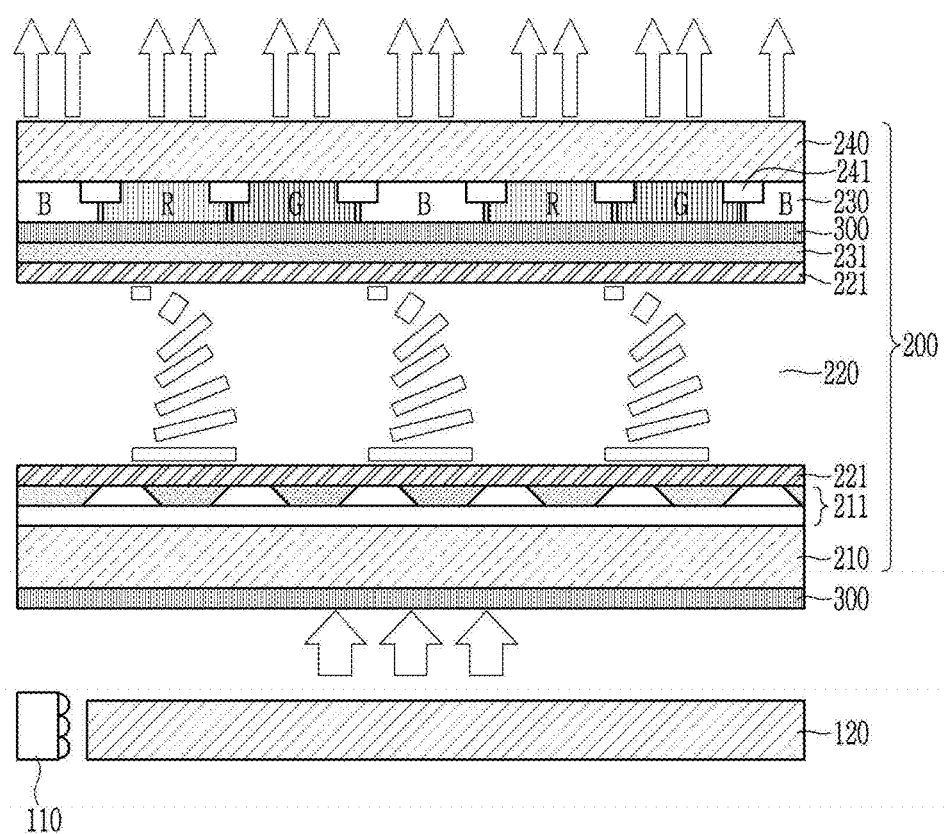
FIG. 2 is a schematic view showing an exemplary embodiment of a cross-section of a layered structure.

FIG. 2 is a cross-sectional view schematically illustrating a display device according to a non-limiting embodiment. Referring to FIG. 2, a display device of an embodiment may include a liquid crystal panel 200, a polarizer 300 disposed under the liquid crystal panel 200, and a backlight unit (BLU) disposed under the polarizer 300.

The liquid crystal panel 200 includes a lower substrate 210, a layered structure, a liquid crystal layer 220 disposed between the lower substrate and the layered structure. The layered structure includes a transparent substrate 240 and a photoluminescent layer 230 that includes a pattern of a quantum dot polymer composite.

The lower substrate 210, also referred to as an array substrate, may be a transparent insulation material substrate (e.g., a glass substrate, a polymer substrate including a polyester such as polyethylene terephthalate (PET) or polyethylene naphthalate (PEN), polycarbonate, and/or a polyacrylate, inorganic material substrate of a polysiloxane, $Al_2O_3$, or ZnO). A wire plate 211 is disposed on the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are known and are not particularly limited.

The liquid crystal layer 220 is disposed on the wire plate 211. The liquid crystal layer 220 may include an alignment layer 221 on and under the liquid crystal layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are known and are not particularly limited.

A lower polarizer 300 may be provided under the lower substrate. Materials and structures of the polarizer 300 are known and are not particularly limited. A backlight unit (e.g., emitting blue light) may be disposed under the polarizer 300. An upper optical element 300 (e.g., an upper polarizer 300) may be provided between the liquid crystal layer 220 and the transparent substrate 240, but it is not limited thereto. For example, the upper polarizer may be disposed between the liquid crystal layer 220 and the photoluminescent layer 230. The polarizer may be any polarizer that can be used in a liquid crystal display device. The polarizer may be TAC (triacetyl cellulose) having a thickness of less than or equal to about 200 µm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may include a light guide panel 120. In an embodiment, the backlight unit may be an edge-type lighting. For example, the backlight unit may include a reflector (not shown), a light guide (not shown) provided on the reflector and providing the liquid crystal panel 200 with a planar light source, and/or at least one optical sheet (not shown) on the light guide, for example, a diffusion plate, a prism sheet, and the like, but is not limited thereto. The backlight unit may not have a light guide panel. In some embodiments, the backlight unit may be a direct-type lighting. For example, the backlight unit may have a reflector (not shown), and may have a plurality of fluorescent lamps disposed on the upper side of the reflector at regular intervals, or may have an LED operating substrate on which a plurality of light emitting diodes are disposed, and over them, a diffusion plate and optionally at least one optical sheet may be provided. Details (e.g., each components of light guide and various optical sheets, a reflector, and the like) of such a backlight unit are known and are not particularly limited.

On the bottom surface of the transparent substrate 240, a black matrix 241 having an opening and hiding the gate line, the data line, and the thin film transistor of the wire plate 211 on the lower substrate 210 may be provided. For example, the black matrix 241 may have a lattice shape. In the openings of the black matrix 241, provided is a photoluminescent layer 230 with a pattern of the quantum dot polymer composite including a first section (R) configured to emit a first light (e.g., red light), a second section (G) configured to emit a second light (e.g., green light), and a third section (B) configured to emit/transmit a third light (e.g., blue light). If desired, the photoluminescent layer may further include at least one fourth section. The fourth section may include a quantum dot emitting different colors (e.g., cyan, magenta, and yellow) from the light emitted from the first to third sections.

In the photoluminescent layer 230, the sections constituting a pattern may be repeated corresponding to the pixel areas formed on the lower substrate. A transparent common electrode 231 may be provided on the photoluminescent layer.

The third section (B) configured to emit/transmit blue light may be a transparent color filter that does not change a light emitting spectrum of the light source. In this case, blue light emitted from the backlight unit may pass the polarizer and the liquid crystal layer and then enter as a polarized light and go out as it is. If needed, the third section may include quantum dots emitting blue light.

If desired, the display device may further include a blue light blocking layer (e.g., a blue cut filter). The blue cut filter may be disposed between a surface of the first section (R) and the second section (G) and the transparent substrate 240 or over the transparent substrate 240 (not shown). The blue cut filter may be in the form of a sheet having an opening in a region corresponding to a pixel area (a third section) displaying blue and may be formed in a region corresponding to first (i.e., red) and second (i.e., green) sections. In an embodiment, the blue cut filter may be formed by alternately stacking at least two layers having different refractive indexes, and thus, may block light in a blue light wavelength region and transmit light in the other wavelength regions. The blocked blue light may be reflected and recycled. The blue cut filter may block blue light emitted from a blue light source from being directly emitted outside.

Embodiments provide an electronic device including the foregoing quantum dot polymer composite. The electronic device may include a light emitting diode (LED), an organic light emitting diode (OLED), a sensor, a solar cell device, an imaging sensor, or a liquid crystal display device, but it is not limited thereto.

Figure 3:
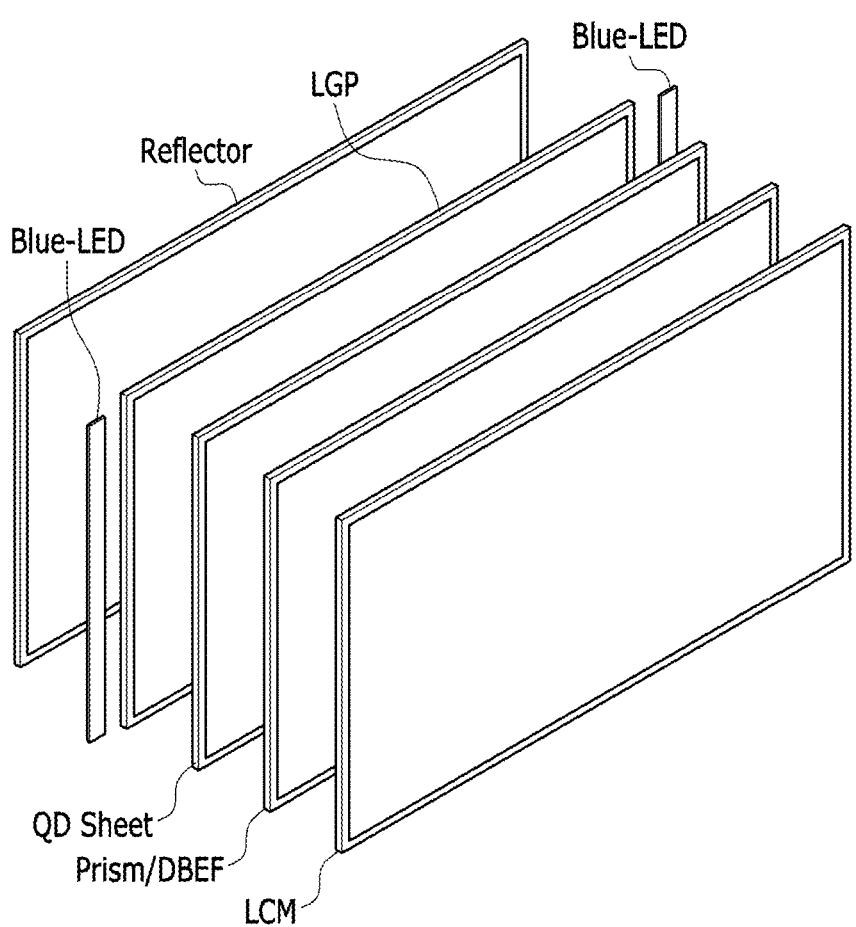
FIG. 3 is a cross-sectional view of a device according to an exemplary embodiment.

In some non-limiting embodiments, a schematic layered structure of a liquid crystal display device including the quantum dot sheet is shown in FIG. 3. A general structure of the liquid crystal display (LCD) are known in the art and FIG. 3 schematically shows the same.

Referring to FIG. 3, the liquid crystal display may include a reflector, a light guide panel (LGP), a Blue LED, a quantum dot polymer composite sheet (QD Sheet), various optical sheets such as a prism sheet, a double brightness enhance film (DBEF), which are layered to form a layered structure, and a liquid crystal module (LCM) or liquid crystal panel may be disposed on the top of the layered structure.

Hereinafter, the embodiments are illustrated in more detail with reference to examples. However, the present disclosure is not limited thereto.

EXAMPLES

Analysis Method

[1] Photoluminescence Analysis

A Hitachi F-7000 spectrometer is used to perform a photoluminescence spectrum analysis with irradiation light of 458 nanometers (nm) (532 nm for red quantum dot (QD)). The photoluminescence spectrum of the quantum dots is obtained.

[2] Light Conversion Efficiency (CE)

(1) The term "light conversion efficiency" refers to a ratio of emitted light (e.g., front light) with respect to incident light. The light conversion efficiency of the quantum dot is a ratio of emitted light amount of the quantum dot with respect to the light amount absorbed by the same (e.g., as being dispersed in a composition or in the form of a polymer composite) from the excitation light (e.g., blue light). A total amount of the excitation light (e.g., a total amount of the blue light, B) may be obtained by integrating a photoluminescent spectrum of the excitation light. A PL spectrum of the quantum dot polymer composite is obtained and from the obtained PL spectrum, an amount of the blue light (B') and an amount of the light (A) that is emitted from the quantum dot polymer composite and has a green and/or red wavelength range are measured, respectively. Then, the light conversion efficiency is calculated by the following equation:

$$A/(B-B') \times 100 = \text{light conversion efficiency (\%)}.$$

In order to obtain the light conversion efficiency of the quantum dot polymer composite, the quantum dot polymer composite film is inserted between the light guide panel and optical films of a 60 inch television (TV) equipped with a blue LED having a peak wavelength of 449 nm. Then, the TV is operated and the luminous properties are analyzed by using a spectro-radiometer (Konica Minolta, CS-2000) placed 30 centimeters in front of the TV to obtain a photoluminescent spectrum of the emitted light.

[3] Viscosity

The viscosity of the composition is measured by using Brookfield LVDV-II-Rheometer or HAAKE Rheostress 600.

[4] Thermogravimetric Analysis

A thermogravimetric analysis is carried out by using TA Q5000 (Q5000IR) (manufactured from TA instruments Co. Ltd.)

[5] Nuclear Magnetic Resonance (NMR) Analysis

A NMR analysis for the compounds and the quantum dot is carried out by using a NMR spectrometer (FT-NMR (500 MHz) (ASCEND 500) of Bruker).

[6] Raman Spectroscopy Analysis

A Raman spectroscopy analysis is made by using a Raman spectrometer manufactured by Via, Renishaw Co. Ltd.

[7] Molecular Weight Analysis

A molecular weight of the encapping material is analyzed by using Vanquish UHPLC System manufactured by Thermo Scientific™.

[8] Analysis of a Development Type

The obtained composite film is developed in a potassium hydroxide solution (concentration: 0.038 wt %, pH: 11) for 600 seconds under the agitation, and a state of a developing solution is observed.

In the solution after the development, if a particle that can be noticed by a naked eye (e.g., a particle having a diameter of 1 mm or greater) is present, it is referred to a strong delamination type.

If there are no particles observed in the solution after the development by the naked eye, it is referred to as a re-dissolution type.

Preparation of Cadmium Free Core-Shell Quantum Dots

Red light emitting quantum dots and green light emitting quantum dots are prepared in accordance with the following procedure.

Reference Example 1: Production of Red or Green Light Emitting Non-Cadmium Quantum Dots (1) 0.2 millimoles (mmol) of indium acetate, optionally 0.1 mmol of zinc acetate, 0.6 mmol of palmitic acid, and 10 milliliters (mL) of 1-octadecene are placed in a flask, subjected to a vacuum state at 120° C. for one hour, and heated to 280° C. after the atmosphere in the flask is exchanged with $N_2$. Then, a mixed solution of 0.1 mmol of tris(trimethylsilyl)phosphine ($TMS_3P$) and 0.5 mL of trioctylphosphine (TOP) is quickly injected, and the reaction proceeds for a predetermined time (e.g., for 20 minutes). The reaction mixture then is rapidly cooled and acetone is added thereto to produce core nanocrystals, which are then separated by centrifugation and dispersed in toluene to obtain a toluene dispersion of the InP and InZnP core nanocrystals for a red emitting QD and a green emitting QD, respectively.

0.3 mmol (0.056 grams, g) of zinc acetate, 0.6 mmol (0.189 g) of oleic acid, and 10 mL of trioctylamine are placed in a flask, subjected to a vacuum state at 120° C. for 10 minutes, and then heated to 220° C. after the atmosphere in the flask is exchanged with $N_2$. Then, a toluene dispersion of the core nanocrystals prepared as described above (optical density: 0.15) and 0.6 mmol of S/TOP (i.e., sulfur dissolved or dispersed in the trioctylphosphine) and Se/TOP (i.e., selenium dissolved or dispersed in the trioctylphosphine) are added to the flask, and then, the resulting mixture is heated to 280° C., while the reaction proceeds for 30 minutes. After the reaction, the reaction solution is quickly cooled to room temperature to obtain a reaction mixture including core/shell semiconductor nanocrystals.

(2) An excess amount of ethanol is added to the reaction mixture including the core/shell semiconductor nanocrystals, which is then centrifuged to remove an extra organic material from the reaction mixture. After centrifugation, the supernatant is discarded and the precipitate is dried and dispersed in chloroform to obtain a quantum dot solution (hereinafter, QD solution or quantum dot chloroform dispersion). A UV-vis absorption spectrum and a photoluminescent spectrum of the QD solution are measured.

The prepared core/shell quantum dots absorb light of a predetermined wavelength (e.g., between 350 nm and 540 nm) to emit (red) light having a wavelength of about 600 to 650 nm or (green) light having a wavelength of about 520 nm to 550 nm, respectively. The quantum yield of the prepared quantum dot is greater than or equal to about 50% (e.g., 50% to 100%).

Preparation of Metal Thiolate Complex Compound

Preparation Example 1

4.5 g of pentaerythritol tetrakis (3-mercaptopropionate) (hereinafter, 4T), 5.2 g of 2,2,3,3-tetrafluoropropyl acrylate, and 2.99 g of zinc chloride ($ZnCl_2$) are dissolved in 2.25 g of propylene glycol monomethyl ether acetate (PGMEA) and 16.9 g of cyclohexyl acetate (CHA). The resulting solution is reacted at 60° C. for 12 hours to synthesize a metal thiolate complex compound having 2,2,3,3-tetrafluoropropyl moiety, a thioether moiety, and a polyvalent metal. The obtained metal thiolate complex compound (hereinafter, also referred to as TFPA) include a moiety represented by Chemical Formula 7:

Chemical Formula 7

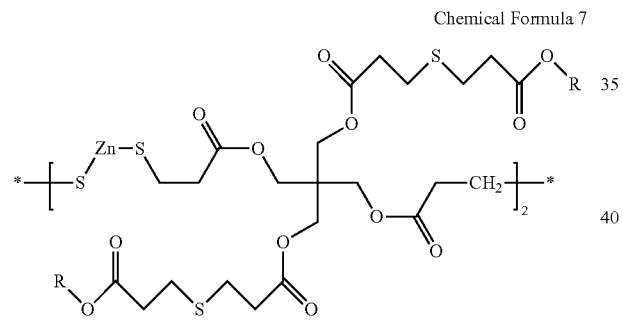

In the above formula, R is 2,2,3,3-tetrafluoropropyl group.

The obtained metal thiolate complex compound has a weight average molecular weight of 1,678 g/mol.

Figure 4:
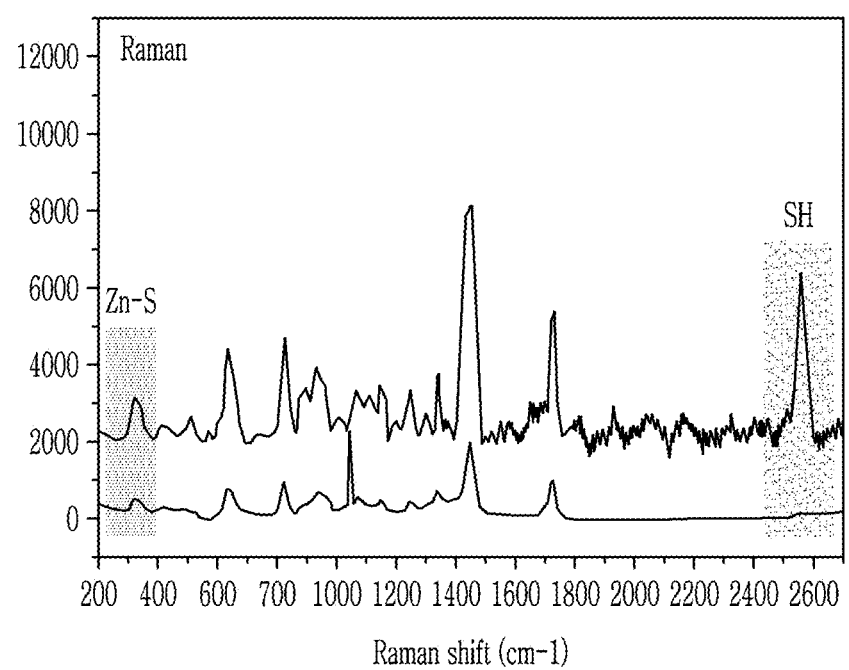
FIG. 4 is a graph of intensity (arbitrary units, a. u.) versus Raman shift (reverse centimeters, $cm^{-1}$), which is a view showing the results of the Raman spectrum analysis for the metal thiolate complex compound and a precursor thereof prepared in Preparation Example 1.

A Raman spectroscopic analysis for the 4T and the obtained metal thiolate complex compound is made and the results are shown in FIG. 4. The results of FIG. 4 confirm that the 4T shows a peak assigned to —SH moiety, which disappears in the obtained metal thiolate complex compound, and the metal thiolate complex compound has a peak due to the bond between the zinc and the sulfur.

Figure 5:
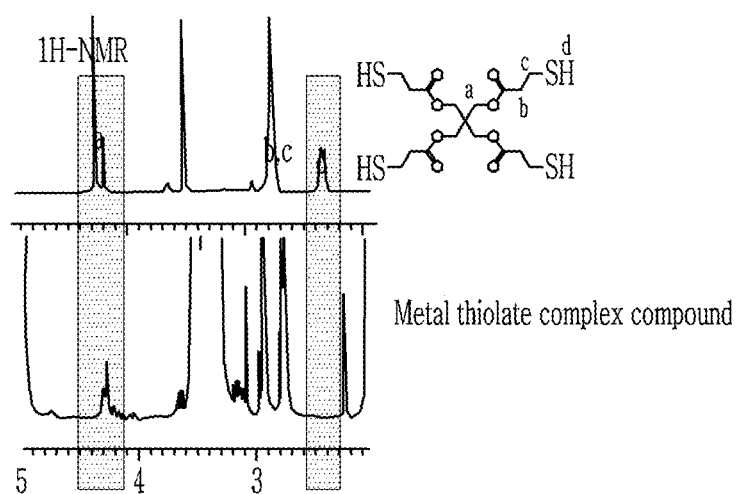
FIG. 5 is a view showing the results of the NMR spectrum analysis for the metal thiolate complex compound and a precursor thereof prepared in Preparation Example 1.

An NMR analysis for the 4T and the obtained metal thiolate complex compound is made and the results are shown in FIG. 5. The results of FIG. 5 confirm that the 4T shows a peak assigned to —SH moiety, which disappears in the obtained metal thiolate complex compound.

Preparation Example 2

A metal thiolate complex compound having 1,1,1,3,3,3-hexafluoroisopropyl moiety, a thioether moiety, and a polyvalent metal (hereinafter, also referred to as HIFA) is prepared in the same manner as set forth in Preparation Example 1 except for using 6.21 g of 1,1,1,3,3,3-hexafluoroisopropyl acrylate instead of 5.2 g of 2,2,3,3-tetrafluoropropyl acrylate. The metal thiolate complex compound include a moiety represented by Chemical Formula 7 (wherein R is a 1,1,1,3,3,3-hexafluoroisopropyl group). The obtained metal thiolate complex compound has a weight average molecular weight of 1,950 g/mol.

Preparation Example 3

A metal thiolate complex compound having 3,3,4,4,5,5,6,6,7,7,8,8,8-tridecafluorooctyl moiety, a thioether moiety, and a polyvalent metal (hereinafter, also referred to as TDFA) is prepared in the same manner as set forth in Preparation Example 1 except for using 11.7 g of 3,3,4,4,5,5,6,6,7,7,8,8,8-tridecafluorooctyl acrylate instead of 5.2 g of 2,2,3,3-tetrafluoropropyl acrylate. The metal thiolate complex compound include a moiety represented by Chemical Formula 7 (wherein R is a 3,3,4,4,5,5,6,6,7,7,8,8,8-tridecafluorooctyl group). The obtained metal thiolate complex compound has a weight average molecular weight of 1,996 g/mol.

Preparation Example 4

A metal thiolate complex compound having 1H,1H-pentadecafluoro-n-octyl moiety, a thioether moiety, and a polyvalent metal (hereinafter, also referred to as PDFA) is prepared in the same manner as set forth in Preparation Example 1 except for using 13.41 g of 1H,1H-pentadecafluoro-n-octylacrylate instead of 5.2 g of 2,2,3,3-tetrafluoropropyl acrylate. The metal thiolate complex compound include a moiety represented by Chemical Formula 7 (wherein R is a 1H,1H-pentadecafluoro-n-octyl group). The obtained metal thiolate complex compound has a weight average molecular weight of 1,975 g/mol.

Preparation Example 5

A metal thiolate complex compound having a trifluoromethyl moiety, a thioether moiety, and a polyvalent metal (hereinafter, also referred to as TAA) is prepared in the same manner as set forth in Preparation Example 1 except for using 3.92 g of trifluoromethyl acrylic acid instead of 5.2 g of 2,2,3,3-tetrafluoropropyl acrylate. The metal thiolate complex compound includes a moiety represented by Chemical Formula 8. The obtained metal thiolate complex compound has a weight average molecular weight of 980 g/mol.

Chemical Formula 8

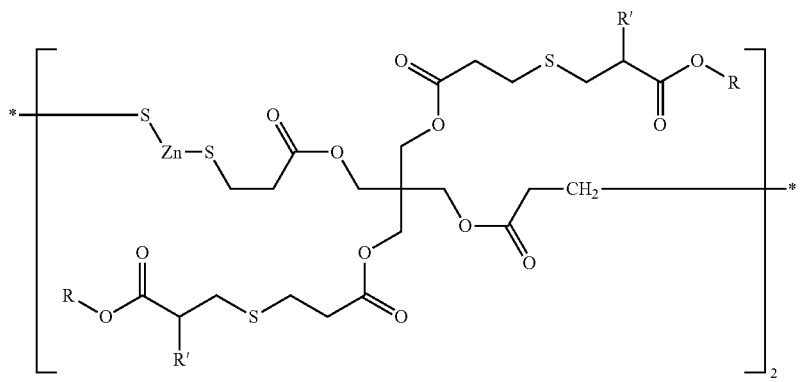

In the above formula, R is H, R' is a trifluoromethyl.

Figure 6:
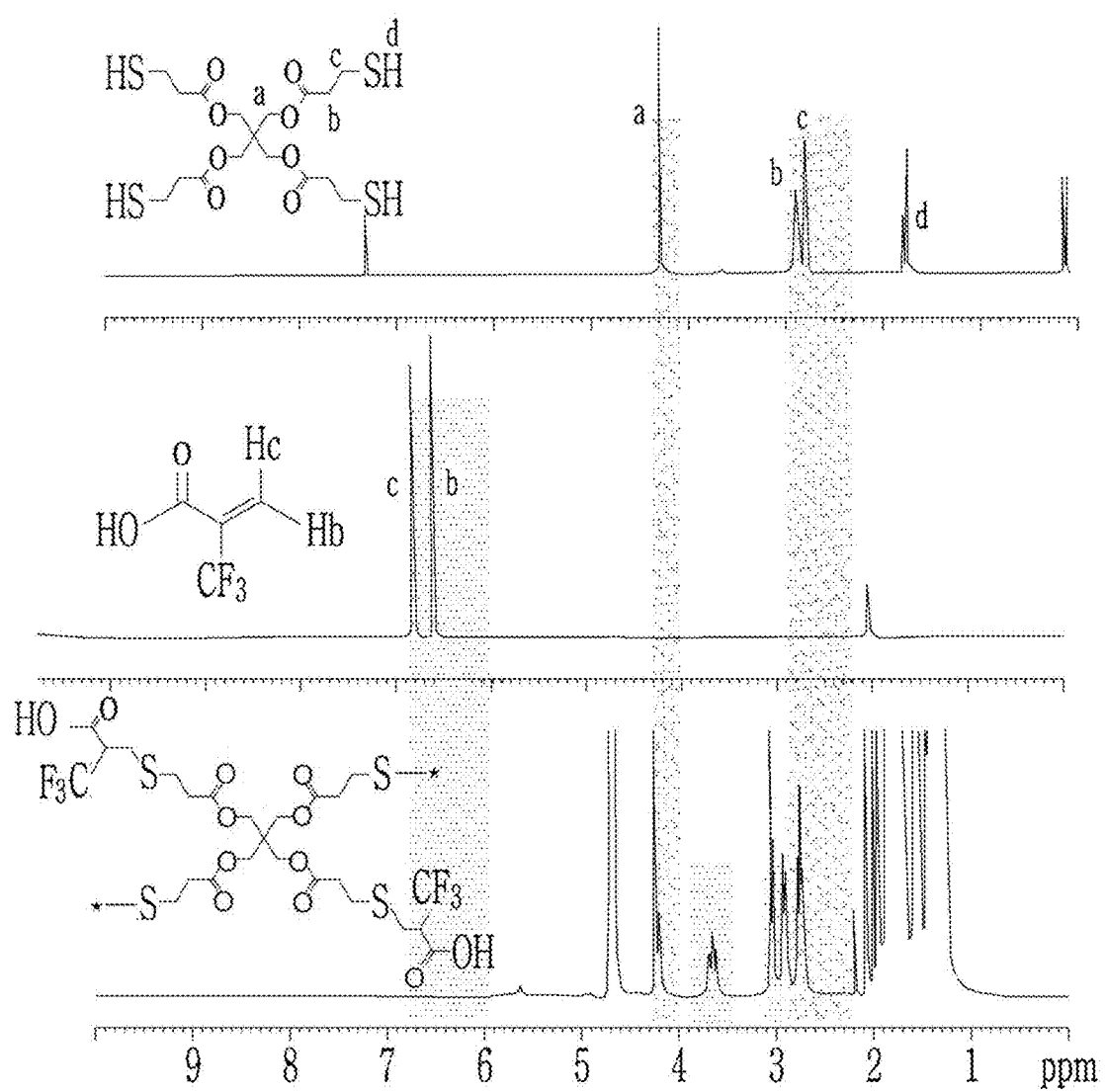
FIG. 6 exhibits graphs of intensity (arbitrary units, a. u.) versus chemical shift (parts per million, ppm), which is a view showing the results of the NMR analysis for the reactants pentaerythritol tetrakis (3-mercaptopropionate) and trifluoromethyl acrylic acid as used and the encapped material as prepared in Example 5.

In other to confirm the synthesis of the foregoing encapped materials and the results are shown in FIG. 6.

Preparation Example 6

A metal thiolate complex compound having a diphenylfluorene moiety, a thioether moiety, and a polyvalent metal (hereinafter, also referred to as cardoA) is prepared in the same manner as set forth in Preparation Example 1 except for using 15.3 g of 9,9-bis[4-(2-acryloyloxyethyloxy)phenyl]fluorene instead of 5.2 g of 2,2,3,3-tetrafluoropropyl acrylate. The metal thiolate complex compound includes a moiety represented by Chemical Formula 9. The obtained metal thiolate complex compound has a weight average molecular weight of 8,986 g/mol.

(TFPA) (0.2126 gram of the solution, conc.: 40 wt %) and 7.4 g of the (green light emitting) quantum dot chloroform dispersion (conc.: 25%) prepared in Reference Example 1 are mixed to provide a quantum dot composition.

[2] The quantum dot composition is stirred at 60° C. for 24 hours to react. After the reaction, ethanol is added to precipitate the product, which is then centrifuged and vacuum dried to provide a quantum dot having the metal thiolate complex compound linked to a surface thereof (hereinafter, the encapped quantum dots).

Example 2

[1] A quantum dot composition is prepared in the same manner as set forth in Example 1 except for using a cyclohexyl acetate solution of the metal thiolate complex Chemical Formula 9

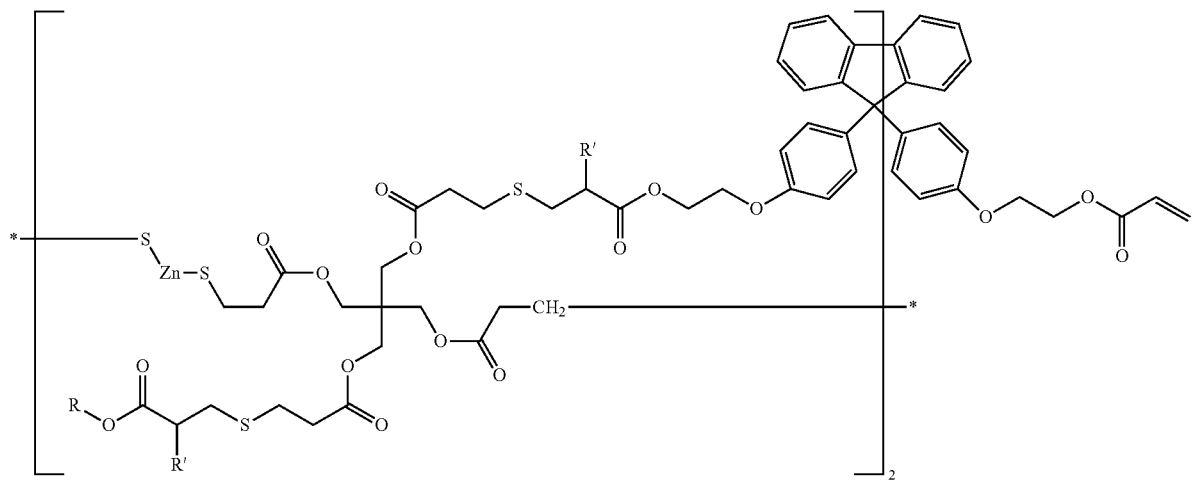

In the formula, R is a 9,9-bis4-(2-acryloyloxyethyloxy)phenyl]fluorene group, R' is H.

Preparation of a quantum dot composition including quantum dots and the metal thiolate complex compound (optionally linked to a surface of the quantum dot)

Example 1

[1] A cyclohexyl acetate solution of the metal thiolate complex compound prepared in Preparation Example 1 compound prepared in Preparation Example 2 (HFIA) (0.2292 gram, conc.: 40 wt %) instead of the TFPA.

[2] Encapped quantum dots are prepared in the same manner as set forth in Example 1 except for using the quantum dot composition prepared in item [1].

Example 3

A quantum dot composition and encapped quantum dots are prepared in the same manner as set forth in Example 1 except for using a cyclohexyl acetate solution of the metal thiolate complex compound prepared in Preparation Example 3 (TDFA) (0.321 gram, conc.: 40 wt %) instead of the TFPA.

Example 4

A quantum dot composition and encapped quantum dots are prepared in the same manner as set forth in Example 1 except for using a cyclohexyl acetate solution of the metal thiolate complex compound prepared in Preparation Example 4 (PDFA) (0.35 gram, conc.: 40 wt %) instead of the TFPA.

Example 5

A quantum dot composition and encapped quantum dots are prepared in the same manner as set forth in Example 1 except for using a cyclohexyl acetate solution of the metal thiolate complex compound prepared in Preparation Example 5 (TAA) (0.389 gram, conc.: 20 wt %) instead of the TFPA.

Example 6

A quantum dot composition and encapped quantum dots are prepared in the same manner as set forth in Example 1 except for using a cyclohexyl acetate solution of the metal thiolate complex compound prepared in Preparation Example 6 (cardoA) (0.780 gram, conc.: 20 wt %) instead of the TFPA.

Comparative Example 1

Encapped quantum dots having a zinc salt linked to a surface thereof are prepared in the same manner as set forth in Example 1 except for using 0.020 g of $ZnCl_2$ instead of the metal thiolate complex compound, instead of the metal thiolate complex compound.

Comparative Example 2

Encapped quantum dots having a zinc salt linked to a surface thereof are prepared in the same manner as set forth in Example 1 except for using 0.064 g of a reaction product between nonafluorobutyl iodide and $ZnCl_2$ instead of the metal thiolate complex compound, instead of the metal thiolate complex compound. The reaction compound between the nonafluorobutyl iodide and $ZnCl_2$ does not include a thio-ether moiety.

Pattern Formation of Quantum Dot Polymer Composite

Example 7

[1] Preparation of Quantum Dot-Binder Dispersion

A cyclohexyl acetate dispersion including the encapped quantum dots prepared in Example 1 is mixed with a PGMEA solution of a binder polymer (bisphenolfluorene epoxy acrylate acid adduct manufactured by AEchem Scientific, (Cas#: 161182-73-6), acid value: 130 milligrams (mg) of KOH per gram (mg KOH/g)) (solvent: propylene glycol monomethyl ether acetate, PGMEA, a concentration of 30 percent by weight, wt %) to form a quantum dot-binder dispersion.

[2] Preparation of the Photosensitive Composition

To the quantum dot-binder dispersion prepared in item [1], a hexaacrylate having the following structure (as a photopolymerizable monomer), ethylene glycol di-3-mercaptopropionate (hereinafter, 2T as a multi-thiol compound), an oxime ester compound (as an initiator), $TiO_2$ (as a light diffusing agent), and PGMEA (as a solvent) are added to obtain a composition.

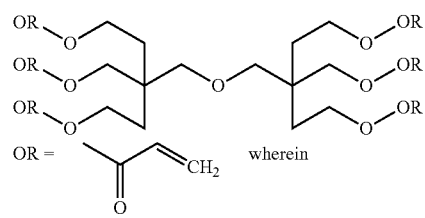

wherein

The prepared compositions includes 12 wt % of the encapped quantum dots, 28 wt % of the binder polymer, 4.5 wt % of the 2T, 2 wt % of the photopolymerizable monomer, and 0.5 wt % of the photoinitiator, 3 wt % of the light diffusing agent, and a balance amount of the solvent, based on a total weight of the composition. A total amount of the solid content is about 50 wt %.

[3] Formation of Quantum Dot-Polymer Composite

The composition obtained from item [2] is spin-coated on a glass substrate at 150 revolutions per minute (rpm) for 5 seconds (s) to provide a film. The obtained film is pre-baked at 100° C. (PRB). The pre-baked film is exposed to light (wavelength: 365 nanometers (nm), intensity: 60 millijoules, mJ) under a mask having a predetermined pattern (e.g., a square dot or stripe pattern) for 1 s (EXP) and developed with a potassium hydroxide aqueous solution (conc.: 0.043%) for 50 seconds (DEV) to obtain a quantum dot polymer composite.

[4] Post Bake (POB) Treatment

The patterned film prepared in item [3] is heated at 180° C. for 30 minutes for a POB treatment.

Figure 7:
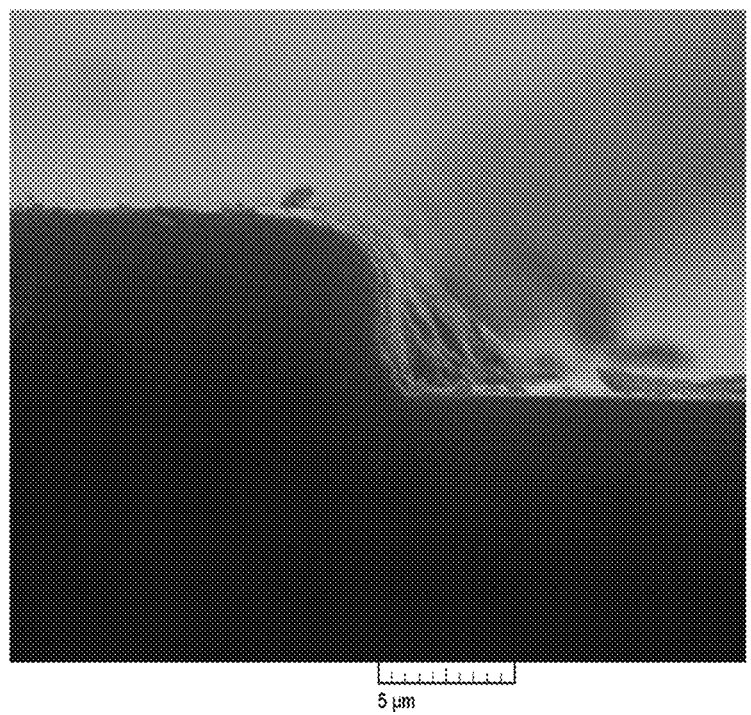
FIG. 7 is a cross-sectional view of a pattern prepared in Example 7.

For a cross-section of the developed pattern, a transmission electron microscopic analysis is conducted and the results are shown in FIG. 7. FIG. 7 shows that the developing process is carried out without any substantial delamination of the film.

For each of the prebaked film and the post baked film, photoluminescent properties and a light conversion efficiency are measured and the results are compiled in Table 1.

Example 8

A quantum dot polymer composite pattern is prepared in the same manner set forth in Example 7 except for using cyclohexyl acetate dispersion including the encapped quantum dots prepared in Example 2.

It is confirmed that the prepared quantum dot composition is developed in a re-dissolution type.

For each of the prebaked film and the post baked film, photoluminescent properties and a light conversion efficiency are measured and the results are compiled in Table 1.

Figure 8:
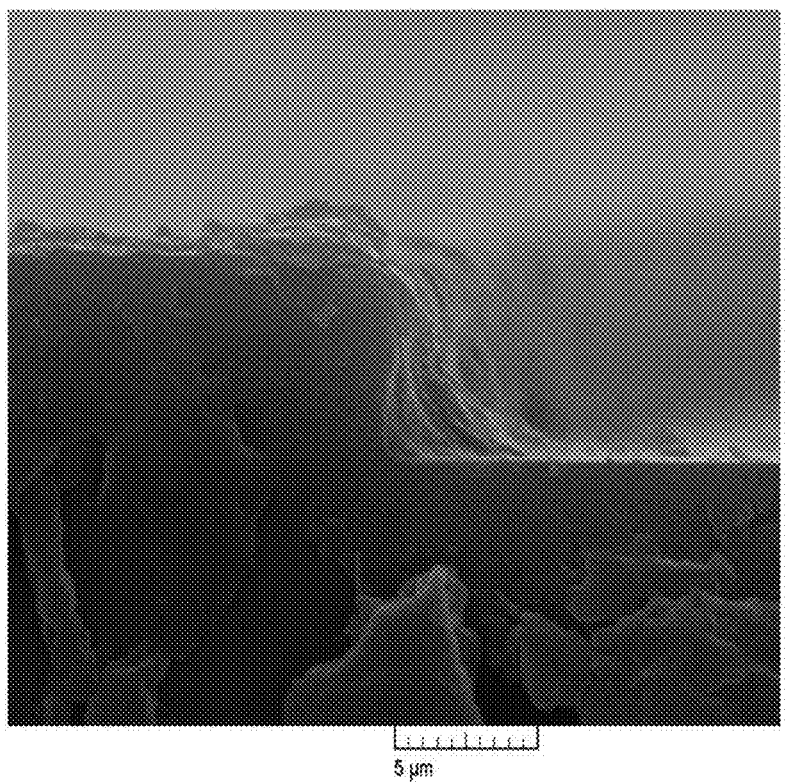
FIG. 8 is a cross-sectional view of a pattern prepared in Example 8.

For a cross-section of the developed pattern, a transmission electron microscopic analysis is conducted and the results are shown in FIG. 8. FIG. 8 shows that the developing process is carried out without any substantial delamination of the film.

Example 9

A quantum dot polymer composite pattern is prepared in the same manner set forth in Example 7 except for using cyclohexyl acetate dispersion including the encapped quantum dots prepared in Example 3.

It is confirmed that the prepared quantum dot composition is developed in a re-dissolution type.

For each of the prebaked film and the post baked film, photoluminescent properties and a light conversion efficiency are measured and the results are compiled in Table 1.

Figure 9:
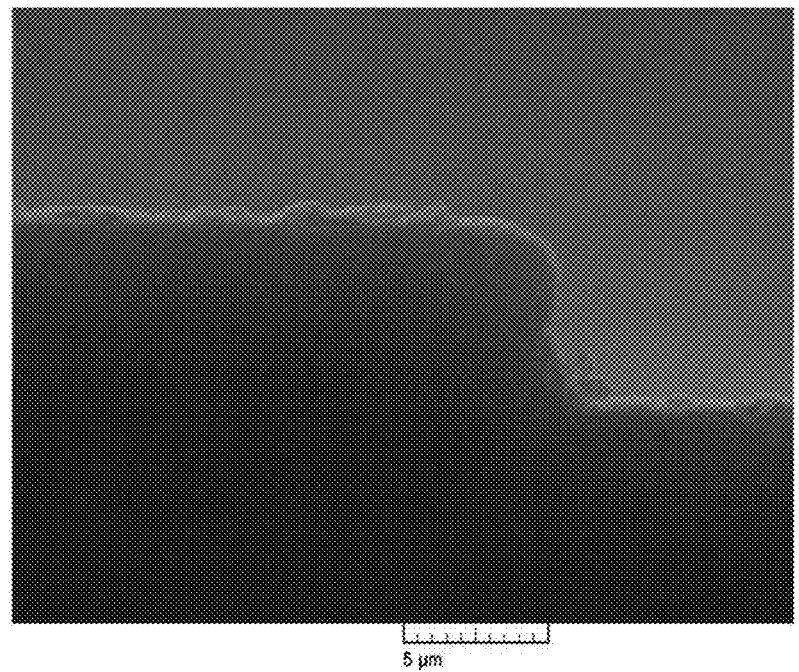
FIG. 9 is a cross-sectional view of a pattern prepared in Example 9.

For a cross-section of the developed pattern, a transmission electron microscopic analysis is conducted and the results are shown in FIG. 9. FIG. 9 shows that the developing process is carried out without any substantial delamination of the film.

Example 10

A quantum dot polymer composite pattern is prepared in the same manner set forth in Example 7 except for using cyclohexyl acetate dispersion including the encapped quantum dots prepared in Example 4.

It is confirmed that the prepared quantum dot composition is developed in a re-dissolution type.

For each of the prebaked film and the post baked film, photoluminescent properties and a light conversion efficiency are measured and the results are compiled in Table 1.

Figure 10:
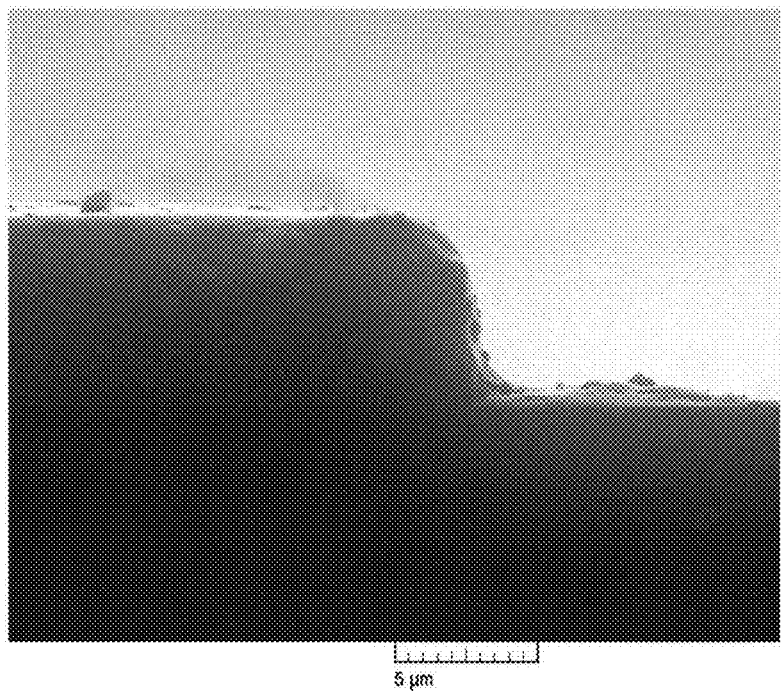
FIG. 10 is a cross-sectional view of a pattern prepared in Example 10.

For a cross-section of the developed pattern, a transmission electron microscopic analysis is conducted and the results are shown in FIG. 10. FIG. 10 shows that the developing process is carried out without any substantial delamination of the film.

Example 11

A quantum dot polymer composite pattern is prepared in the same manner set forth in Example 7 except for using cyclohexyl acetate dispersion including the encapped quantum dots prepared in Example 5.

It is confirmed that the prepared quantum dot composition is developed in a re-dissolution type.

For each of the prebaked film and the post baked film, photoluminescent properties and a light conversion efficiency are measured and the results are compiled in Table 1.

Figure 11:
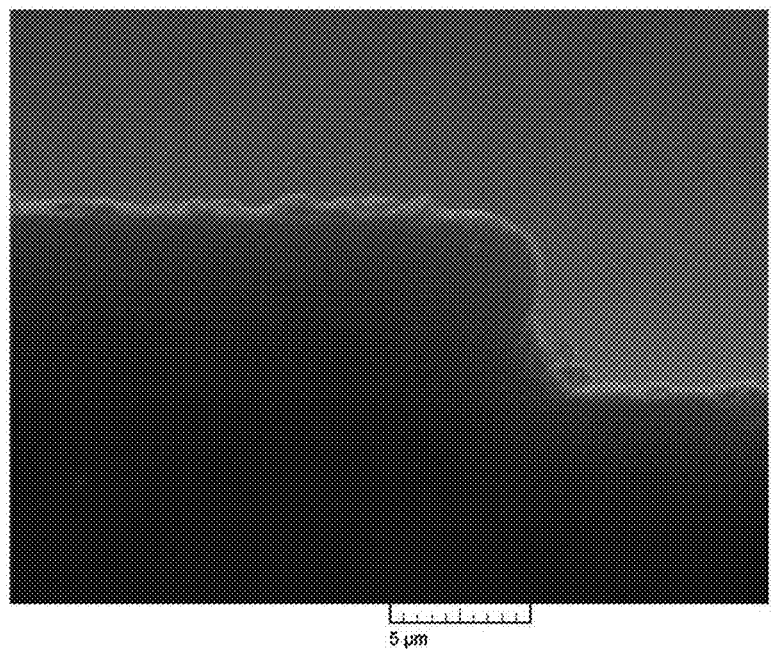
FIG. 11 is a cross-sectional view of a pattern prepared in Example 11.

For a cross-section of the developed pattern, a transmission electron microscopic analysis is conducted and the results are shown in FIG. 11. FIG. 11 shows that the developing process is carried out without any substantial delamination of the film.

Example 12

A quantum dot polymer composite pattern is prepared in the same manner set forth in Example 7 except for using cyclohexyl acetate dispersion including the encapped quantum dots prepared in Example 6.

It is confirmed that the prepared quantum dot composition is developed in a re-dissolution type.

For each of the prebaked film and the post baked film, photoluminescent properties and a light conversion efficiency are measured and the results are compiled in Table 1.

Figure 12:
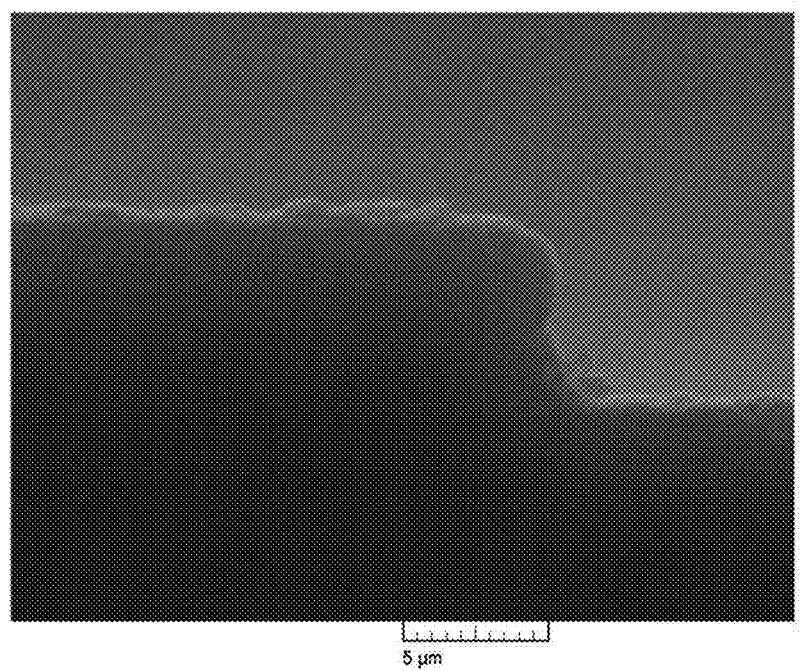
FIG. 12 is a cross-sectional view a pattern prepared in Example 12.

For a cross-section of the developed pattern, a transmission electron microscopic analysis is conducted and the results are shown in FIG. 12. FIG. 12 shows that the developing process is carried out without any substantial delamination of the film.

Comparative Example 3

A quantum dot polymer composite pattern is prepared in the same manner set forth in Example 7 except for preparing a quantum dot dispersion using the encapped quantum dots prepared in Comparative Example 1 and obtaining a photosensitive composition therefrom. The initial viscosity of the photosensitive composition as prepared is about 5 centipoise (cps).

During the developing process, the quantum dot polymer composite is delaminated and the pattern disappears, which confirm that developing of the composite prepared from the composition is made in a strong delamination type.

For each of the prebaked film and the post baked film, photoluminescent properties and a light conversion efficiency are measured and the results are compiled in Table 1.

Comparative Example 4

A quantum dot polymer composite pattern is prepared in the same manner set forth in Example 7 except for preparing a quantum dot dispersion using the green light emitting quantum dots prepared in Reference Example 1 and obtaining a photosensitive composition therefrom. The developing type of the composition is confirmed as a strong delamination type.

For each of the prebaked film and the post baked film, photoluminescent properties and a light conversion efficiency are measured and the results are compiled in Table 1.

Comparative Example 5

A quantum dot polymer composite pattern is prepared in the same manner set forth in Example 7 except for preparing a quantum dot dispersion using the quantum dots prepared in Reference Example 1 and obtaining a photosensitive composition therefrom. The composite is patterned in a strong delamination type.

For each of the prebaked film and the post baked film, photoluminescent properties and a light conversion efficiency are measured and the results are compiled in Table 1.

TABLE 1

|  | Example 7 (TFPA) | Example 8 (HFIA) | Example 9 (TDPA) | Example 10 (PDFA) | Example 11 (TAA) | Example 12 (cardoA) | Comparative Example 3 | Comparative Example 4 | Comparative Example 5 |
|---|---|---|---|---|---|---|---|---|---|
| PRB CE | 30% | 30% | 30% | 30% | 30% | 33% | 30% | 29% | 27% |
| POB CE | 28% | 27% | 27% | 27% | 30% | 31% | 28% | 25% | 23% |
| Maintenance ratio | 93% | 90% | 90% | 90% | 100% | 94% | 93% | 86% | 85% |
| patternability | good | good | good | good | good | good | Disappearance of pattern | Disappearance of pattern | patterned |

TABLE 1-continued

| | Example 7 (TFPA) | Example 8 (HFIA) | Example 9 (TDPA) | Example 10 (PDFA) | Example 11 (TAA) | Example 12 (cardoA) | Comparative Example 3 | Comparative Example 4 | Comparative Example 5 |
|---|---|---|---|---|---|---|---|---|---|
| Developing type | re-dissolution | re-dissolution | re-dissolution | re-dissolution | re-dissolution | re-dissolution | strong delamination | strong delamination | strong delamination |

PRB CE: the light conversion efficiency for the prebaked film
POB CE: the light conversion efficiency for the post baked film
Maintenance ratio: the ratio of POB CE to PRB CE The results of Table 1 confirm that the quantum dot polymer composite patterns of Examples 7 to 12 may maintain improved luminous properties while it shows good patternability and enhanced re-dissolubility. In contrast, the quantum dot polymer composites of Comparative Examples 3 and 4 cannot form a pattern, and the quantum dot polymer composites of Comparative Examples 3 to 5 are developed in a strong delamination type.

Experimental Example 1

Each of the photosensitive compositions prepared in Example 7 and Comparative Example 3 is kept at room temperature for five days. The viscosity is measured at the beginning, after 3 days, and after 5 days. Changes in the viscosity is shown in FIG. 13.

Figure 13:
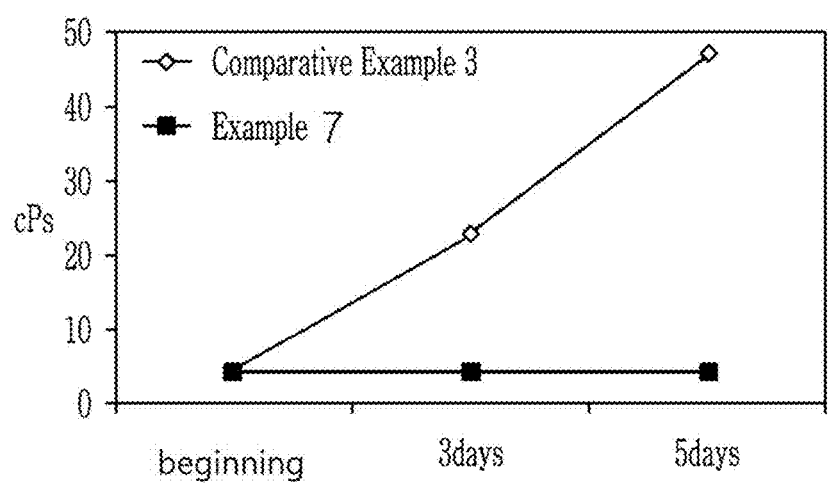
FIG. 13 is a diagram showing change in the viscosity (centipoise, cPs) of photosensitive compositions prepared as described in Example 7 and Comparative Example 3, and measured in Experimental Example 1.

The results of FIG. 13 confirm that the photosensitive composition of Comparative Example 3 shows a viscosity 10 times higher than its initial value after 5 days, but the photosensitive composition of Example 7 has a viscosity that has substantially no increase from its initial value even after 5 days.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot composition comprising:
a quantum dot,
a metal thiolate complex compound, and
a solvent,
wherein the metal thiolate complex compound comprises a hydrophobic moiety, a thioether moiety, and a polyvalent metal, and
wherein the hydrophobic moiety comprises a fluorinated organic group, a multi-aromatic ring-containing group having a backbone structure comprising a quaternary carbon atom, which is a part of a cyclic group, and two aromatic rings bound to the quaternary carbon atom, or a combination thereof,
wherein the metal thiolate complex compound is represented by Chemical Formula 1:

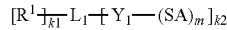

Chemical Formula 1 wherein,
$R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; $-NH_2$; a substituted or unsubstituted $-NR^aR^{a1}$, wherein $R^a$ and $R^{a1}$ are the same or different, and are independently hydrogen or a C1 to C30 linear or branched alkyl group and provided that $R^a$ and $R^{a1}$ are not both hydrogen; an isocyanate group; a halogen; $-R_bOR^{b1}$ wherein $R^b$ is a substituted or unsubstituted C1 to C20 alkylene group and $R^{b1}$ is hydrogen or a C1 to C20 linear or branched alkyl group; an acyl halide group; $-C(=O)OR^{c1}$ wherein $R^{c1}$ is hydrogen or a C1 to C20 linear or branched alkyl group; $-CN$; $-C(=O)ONR^dR^{d1}$ wherein $R^d$ and $R^{d1}$ are the same or different, and are independently hydrogen or a C1 to C20 linear or branched alkyl group; or a combination thereof, $L_1$ is a carbon atom; a substituted or unsubstituted C2 to C30 alkylene group; a substituted or unsubstituted C2 to C30 alkylene group having at least one methylene replaced with a sulfonyl group, a carbonyl group, an ether group, a sulfide group, a sulfoxide group, an ester group, an amide group, or a combination thereof; a substituted or unsubstituted C3 to C30 cycloalkylene group; a substituted or unsubstituted C3 to C30 heterocycloalkylene group; a substituted or unsubstituted C6 to C30 arylene group; or a substituted or unsubstituted C3 to C30 heteroarylene group, $Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene is replaced by a sulfonyl group, a carbonyl group, an ether group, a sulfide group, a sulfoxide group, an ester group, an amide group, an imine group, or a combination thereof, A is $-M(R^2)_{a-1}$, $-CR=CR^3-Y_2-R^4$, or $-CHRCHR^3-Y_2-R^4$, wherein R is hydrogen or a methyl group, M is Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof, a is a valance of the M, $R^2$ is a group selected from a thiolate containing organic group, a halide, a (meth)acrylate group, a dialkyldithiocarbamate group, an acetate group, a propionate group, a butyrate group, a valerate group, and a carboxy ethyl acrylate group, $R^3$ is hydrogen, $-COOH$, or a C1 to C10 alkyl group, $Y_2$ is a single bond, a substituted or unsubstituted divalent C1 to C10 alkylene group, a sulfonyl group, a carbonyl group, an ether group, a sulfide group, a sulfoxide group, an ester group, an amide group, an imine group, or a combination thereof, and $R^4$ is the fluorinated organic group or the multi-aromatic ring-containing group, provided that at least one of the A is $-M(R^2)_{a-1}$ and at least one of the A is $-CR=CR^3-Y_2-R^4$ or $-CHRCHR^3-Y_2-R^4$, m is an integer of at least 1, k1 is 0 or an integer of 1 or more and k2 is an integer of 1 or more, the sum of m and k2 is an integer of greater than or equal to 3, m does not exceed the valence of $Y_1$; and the sum of k1 and k2 does not exceed the valence of $L_1$.

2. The quantum dot composition of claim 1, wherein the metal thiolate complex compound is bound to a surface of the quantum dot and is present as a part of a quantum dot complex.

3. The quantum dot composition of claim 2, wherein in the quantum dot complex, the polyvalent metal binds the metal thiolate complex compound to the quantum dot.

4. The quantum dot composition of claim 1, wherein the polyvalent metal comprises Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof.

5. The quantum dot composition of claim 1, wherein the metal thiolate complex compound comprises a dithiolene moiety represented by *—S-M-S—*, wherein * is a portion linked to an atom constituting the metal thiolate complex compound.

6. The quantum dot composition of claim 1, wherein in the metal thiolate complex compound, the polyvalent metal is directly linked to the thioether moiety.

7. The quantum dot composition of claim 1, wherein the fluorinated organic group comprises a fluorinated hydrocarbon group, and wherein the backbone structure of the multi-aromatic ring-containing group comprises a moiety represented by Chemical Formula A:

Chemical Formula A

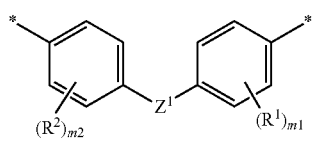

wherein

* indicates a portion that is linked to an adjacent atom, each of $R^1$ and $R^2$ is independently hydrogen, a halogen, or a substituted or unsubstituted C1 to C20 alkyl group, m1 and m2 are the same or different, and are independently an integer ranging from 0 to 4, $Z^1$ is a linking moiety represented by any one of Chemical Formulae A-1 to A-6, and, in Chemical Formulae A-1 to A-6, * indicates a portion that is linked to an adjacent atom in the aromatic ring:

Chemical Formula A-1

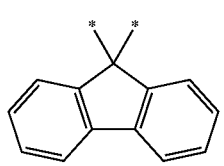

Chemical Formula A-2

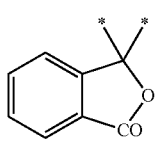

Chemical Formula A-3

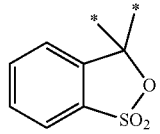

Chemical Formula A-4

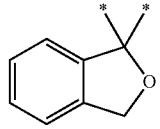

Chemical Formula A-5

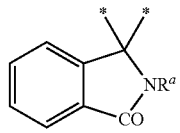

wherein $R^a$ is hydrogen, an ethyl group, —$C_2H_4Cl$, —$C_2H_4OH$, —$CH_2CH{=}CH_2$, or a phenyl group, Chemical Formula A-6

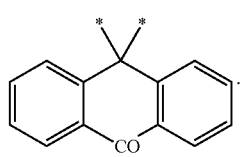

8. The quantum dot composition of claim 7, wherein the fluorinated hydrocarbon group comprises a C1 to C50 fluorinated linear or branched alkyl group or a C1 to C50 fluorinated linear or branched alkenyl group.

9. The quantum dot composition of claim 1, wherein the metal thiolate complex compound is represented by Chemical Formula 1-1:

Chemical Formula 1-1

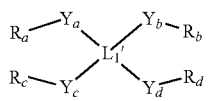

wherein $L_1{'}$ is carbon; a substituted or unsubstituted C2 to C30 alkylene group; a substituted or unsubstituted C2 to C30 alkylene group having at least one methylene replaced with a sulfonyl group, a carbonyl group, an ether group, a sulfide group, a sulfoxide, an ester group, an amide group, or a combination thereof; a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_a$ to $Y_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene is replaced by a sulfonyl group, a carbonyl group, an ether group, a sulfide group, a sulfoxide group, an ester group, an amide group, an imine group, or a combination thereof, and each of $R_a$ to $R_d$ is independently $R^1$ of Chemical Formula 1 or *-SA, provided that at least two of them are *-SA, wherein A is -M($R^2$)$_{a-1}$, —CR=$CR^3$—$Y_2$—$R^4$, or —CHRCHR$^3$—$Y_2$—$R^4$ (wherein M is Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof, a is a valance of the M, R is hydrogen or a methyl group, $R^2$ is a group selected from a thiolate containing organic group, a halide, a (meth)acrylate group, a dialkyldithiocarbamate group, an acetate group, a propionate group, a butyrate group, a valerate group, and a carboxy ethyl acrylate group, $R^3$ is hydrogen, —COOH, or a C1 to C10 alkyl group, $Y_2$ is a single bond, a substituted or unsubstituted C1 to C10 alkylene group, a sulfonyl group, a carbonyl group, an ether group, a sulfide group, a sulfoxide group, an ester group, an amide group, an imine group, or a combination thereof, and $R^4$ is the fluorinated organic group or the multi-aromatic ring-containing group, provided that in the compound represented by Chemical Formula 1-1, at least one of the A is -M($R^2$)$_{a-1}$ and at least one of the A is —CR=$CR^3$—$Y_2$—$R^4$ or —CHRCHR$^3$—$Y_2$—$R^4$.

10. The quantum dot composition of claim 1, wherein the metal thiolate complex compound comprises a moiety represented by Chemical Formula 1-1-1:

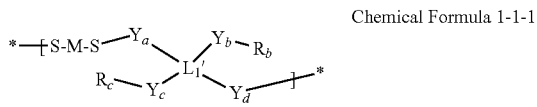

Chemical Formula 1-1-1 wherein

M is Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof, $L_1'$ is carbon; a substituted or unsubstituted C2 to C30 alkylene group; a substituted or unsubstituted C2 to C30 alkylene group having at least one methylene replaced with a sulfonyl group, a carbonyl group, an ether group, a sulfide group, a sulfoxide group, an ester group, an amide group, or a combination thereof; a substituted or unsubstituted C6 to C30 arylene group; a substituted or unsubstituted C3 to C30 heteroarylene group; a substituted or unsubstituted C3 to C30 cycloalkylene group; or a substituted or unsubstituted C3 to C30 heterocycloalkylene group, $Y_a$ to $Y_d$ are the same or different, and are independently a single bond, a substituted or unsubstituted C1 to C30 alkylene group, a substituted or unsubstituted C2 to C30 alkenylene group, or a substituted or unsubstituted C1 to C30 alkylene group or a substituted or unsubstituted C2 to C30 alkenylene group wherein at least one methylene is replaced by a sulfonyl group, a carbonyl group, an ether group, a sulfide group, a sulfoxide group, an ester group, an amide group, an imine group, or a combination thereof, and each of $R_b$ and $R_c$ is independently $R^1$ of Chemical Formula 1 or SA, provided that at least one of them is SA, A is -M($R^2$)$_{a-1}$, —CR=$CR^3$—$Y_2$—$R^4$, or —CHRCHR$^3$—$Y_2$—$R^4$ (wherein R is hydrogen or a methyl group, M is the same as defined above, a is a valance of the M, $R^2$ is a group selected from a thiolate-containing organic group, a halide, a (meth)acrylate group, a dialkyldithiocarbamate group, an acetate group, a propionate group, a butyrate group, a valerate group, and a carboxy ethyl acrylate group, $R^3$ is hydrogen, —COOH, or a C1 to C10 alkyl group, $Y_2$ is a single bond, a substituted or unsubstituted C1 to C10 divalent alkylene group, a sulfonyl group, a carbonyl group, an ether group, a sulfide group, a sulfoxide group, an ester group, an amide group, or a combination thereof, and $R^4$ is the fluorinated organic group or the multi-aromatic ring-containing group, provided that in the moiety represented by Chemical Formula 1-1-1, at least one of the A is —CR=$CR^3$—$Y_2$—$R^4$ or —CHRCHR$^3$—$Y_2$—$R^4$, and

* indicates a portion that is linked to an adjacent atom.

11. The quantum dot composition of claim 1, wherein the metal thiolate complex compound comprises a reaction product among a thiol compound having at least two thiol groups, an ene compound having the hydrophobic moiety and a carbon-carbon double bond, and a metal salt comprising the aforementioned metal.

12. The quantum dot composition of claim 11, wherein the thiol compound comprises glycol di-3-mercaptopropionate, glycol dimercaptoacetate, trimethylolpropane tris(3-mercaptopropionate), pentaerythritol tetrakis(3-mercaptopropionate), pentaerythritol tetrakis(2-mercaptoacetate), 1,6-hexanedithiol, 1,3-propanedithiol, 1,2-ethanedithiol, polyethylene glycol dithiol comprising 1 to 10 ethylene glycol repeating units, or a combination thereof, wherein the ene compound comprises a mono (meth)acrylate compound having the hydrophobic moiety, a mono(meth)acrylic acid having the hydrophobic moiety, a multiaromatic ring containing compound having two (meth)acryloyl moiety, a mono vinyl acetate compound having the hydrophobic moiety, a monovinyl compound having the hydrophobic moiety, or a combination thereof, and wherein the metal salt comprises a zinc halide, an indium halide, or a combination thereof.

13. The quantum dot composition of claim 1, wherein the metal thiolate complex compound has a weight average molecular weight of greater than or equal to about 200 Daltons and less than or equal to about 5,000 Daltons.

14. The quantum dot composition of claim 1, wherein the quantum dot comprises a Group II-VI compound, a Group III-V compound, a Group IV-VI compound, a Group IV element or compound, a Group I-III-VI compound, a Group I-II-IV-VI compound, or a combination thereof.

15. The quantum dot composition of claim 1, wherein the quantum dot comprises a core comprising a first semiconductor nanocrystal and a shell disposed on the core and comprising a second semiconductor nanocrystal.

16. The quantum dot composition of claim 1, wherein the polyvalent metal comprises the same metal as a metal present at a surface of the quantum dot.

17. The quantum dot composition of claim 1, wherein the quantum dot comprises RCOOH, RNH$_2$, R$_2$NH, R$_3$N, RSH, R$_3$PO, R$_3$P, ROH, RCOOR', RPO(OH)$_2$, R$_2$POOH or a combination thereof, and wherein R and R' are the same or different, and are independently a C1 to C24 aliphatic hydrocarbon or a C5 to C20 aromatic hydrocarbon.

18. The quantum dot composition of claim 1, wherein the solvent comprises an ethylene glycol, an ethylene glycol ether, an ethylene glycol ether acetate, a propylene glycol, a propylene glycol ether, propylene glycol acetate, an amide solvent, a ketone solvent, a substituted or unsubstituted aromatic hydrocarbon, a petroleum solvent, an acetic acid ester, an alkyl ether solvent, a substituted or unsubstituted aliphatic hydrocarbon solvent, a lactone solvent, or a combination thereof.

19. The quantum dot composition of claim 1, further comprising
a binder polymer;
a polymerizable monomer comprising a carbon-carbon double bond; and
a photoinitiator.

20. The quantum dot composition of claim 19, wherein the binder polymer has an acid value of greater than or equal to about 50 milligrams of KOH per gram of the polymer (mg KOH/g) and less than or equal to about 250 mg KOH/g, and wherein the binder polymer comprises:
a copolymer of a monomer combination comprising a first monomer comprising a carboxylic acid group and a carbon-carbon double bond, a second monomer comprising a carbon-carbon double bond and a hydrophobic moiety and not comprising a carboxylic acid group, and optionally, a third monomer comprising a carbon-carbon double bond and a hydrophilic moiety and not comprising a carboxylic acid group;
a multi-aromatic ring-containing polymer comprising a carboxylic acid group and comprising a backbone structure in a main chain, wherein the backbone structure comprises a quaternary carbon atom, which is a part of a cyclic group, and two aromatic rings bound to the quaternary carbon atom; or
a combination thereof.

21. The quantum dot composition of claim 19, wherein the composition further comprises a multi-thiol compound having at least two thiol groups.

22. A quantum dot polymer composite comprising:
a polymer matrix; and
a plurality of quantum dots and a metal thiolate complex compound dispersed in the polymer matrix,
wherein the metal thiolate complex compound comprises a hydrophobic moiety, a thioether moiety, and a polyvalent metal,
wherein the hydrophobic moiety comprises a fluorinated organic group, a multi-aromatic ring-containing group having a backbone structure comprising a quaternary carbon atom, which is a part of a cyclic group, and two aromatic rings bound to the quaternary carbon atom, or a combination thereof,
wherein the metal thiolate complex compound is represented by Chemical Formula 1:

Chemical Formula 1

wherein,
$R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; $-NH_2$; a substituted or unsubstituted $-NR^aR^{a\prime}$, wherein $R^a$ and $R^{a\prime}$ are the same or different, and are independently hydrogen or a C1 to C30 linear or branched alkyl group and provided that $R^a$ and $R^{a\prime}$ are not both hydrogen; an isocyanate group; a halogen; $-R^bOR^{b\prime}$ wherein $R^b$ is a substituted or unsubstituted C1 to C20 alkylene group and $R^{b\prime}$ is hydrogen or a C1 to C20 linear or branched alkyl group; an acyl halide group; $-C(=O)OR^{c\prime}$ wherein $R^{c\prime}$ is hydrogen or a C1 to C20 linear or branched alkyl group; $-CN$; $-C(=O)ONR^dR^{d\prime}$ wherein $R^d$ and $R^{d\prime}$ are the same or different, and are independently hydrogen or a C1 to C20 linear or branched alkyl group; or a combination thereof,
$L_1$ is a carbon atom; a substituted or unsubstituted C2 to C30 alkylene group; a substituted or unsubstituted C2 to C30 alkylene group having at least one methylene replaced with a sulfonyl group, a carbonyl group, an ether group, a sulfide group, a sulfoxide group, an ester group, an amide group, or a combination thereof; a substituted or unsubstituted C3 to C30 cycloalkylene group; a substituted or unsubstituted C3 to C30 heterocycloalkylene group; a substituted or unsubstituted C6 to C30 arylene group; or a substituted or unsubstituted C3 to C30 heteroarylene group,
$Y_1$ is a single bond, a substituted or unsubstituted C1 to C30 alkylene group, a substituted or unsubstituted C2 to C30 alkenylene group, or a C1 to C30 alkylene group or a C2 to C30 alkenylene group wherein at least one methylene is replaced by a sulfonyl group, a carbonyl group, an ether group, a sulfide group, a sulfoxide group, an ester group, an amide group, an imine group, or a combination thereof,
A is $-M(R^2)_{a-1}$, $-CR=CR^3-Y_2-R^4$, or $-CHRCHR^3-Y_2-R^4$, wherein R is hydrogen or a methyl group, M is Al, Mg, Ca, Sc, Ti, V, Cr, Mn, Fe, Co, Ni, Cu, Zn, Ga, Sr, Y, Zr, Nb, Mo, Cd, In, Ba, Au, Hg, Tl, or a combination thereof, a is a valance of the M, $R^2$ is a group selected from a thiolate containing organic group, a halide, a (meth)acrylate group, a dialkyldithiocarbamate group, an acetate group, a propionate group, a butyrate group, a valerate group, and a carboxy ethyl acrylate group, $R^3$ is hydrogen, $-COOH$, or a C1 to C10 alkyl group, $Y_2$ is a single bond, a substituted or unsubstituted divalent C1 to C10 alkylene group, a sulfonyl group, a carbonyl group, an ether group, a sulfide group, a sulfoxide group, an ester group, an amide group, an imine group, or a combination thereof, and $R^4$ is the fluorinated organic group or the multi-aromatic ring-containing group, provided that at least one of the A is $-M(R^2)_{a-1}$ and at least one of the A is $-CR=CR^3-Y_2-R^4$ or $-CHRCHR^3-Y_2-R^4$,
m is an integer of at least 1,
k1 is 0 or an integer of 1 or more and k2 is an integer of 1 or more,
the sum of m and k2 is an integer of greater than or equal to 3,
m does not exceed the valence of $Y_1$; and
the sum of k1 and k2 does not exceed the valence of $L_1$.

23. The quantum dot polymer composite of claim 22, wherein the polymer matrix comprises a crosslinked polymer and a binder polymer comprising a carboxylic acid group.

24. A layered structure comprising:
a substrate; and
a luminescent layer disposed on the substrate,
wherein the luminescent layer comprises at least one repeating section emitting light of a predetermined wavelength, and
wherein the repeating section comprises a quantum dot polymer composite of claim 22.

25. The layered structure of claim 24, wherein the repeating section comprises a first section configured to emit a first light and a second section configured to emit a second light, wherein a peak wavelength of the second light is different from that of the first light.

26. A display device comprising:
   the layered structure of claim 24; and
   a light source configured to provide incident light with the luminescent layer of the layered structure.

27. The display device of claim 26, wherein the light source comprises at least one emitting diode.

28. The display device of claim 26, wherein the display device further comprises a lower substrate and a liquid crystal layer, wherein the liquid crystal layer is disposed between the lower substrate and the layered structure to face the luminescent layer.

* * * * *